(12) United States Patent
Wang et al.

(10) Patent No.: US 11,094,727 B2
(45) Date of Patent: Aug. 17, 2021

(54) CAMERA MODULE, MOLDING PHOTOSENSITIVE ASSEMBLY THEREOF, MANUFACTURING METHOD THEREOF AND ELECTRONIC DEVICE

(71) Applicant: NINGBO SUNNY OPOTECH CO., LTD., Zhejiang (CN)

(72) Inventors: Mingzhu Wang, Zhejiang (CN); Takehiko Tanaka, Nara (JP); Nan Guo, Zhejiang (CN); Zhenyu Chen, Zhejiang (CN); Bojie Zhao, Zhejiang (CN)

(73) Assignee: Ningbo Sunny Opotech Co., Ltd., Zhejiang (CN)

( * ) Notice: Subject to any disclaimer, the term of this patent is extended or adjusted under 35 U.S.C. 154(b) by 2 days.

(21) Appl. No.: 16/604,715

(22) PCT Filed: Apr. 12, 2018

(86) PCT No.: PCT/CN2018/082819
§ 371 (c)(1),
(2) Date: Oct. 11, 2019

(87) PCT Pub. No.: WO2018/188628
PCT Pub. Date: Oct. 18, 2018

(65) Prior Publication Data
US 2020/0156295 A1 May 21, 2020

(30) Foreign Application Priority Data
Apr. 12, 2017 (CN) .......................... 201710236249.6

(51) Int. Cl.
*H04N 5/225* (2006.01)
*H01L 27/146* (2006.01)
(Continued)

(52) U.S. Cl.
CPC .. *H01L 27/14618* (2013.01); *B29C 45/14467* (2013.01); *B29C 45/14639* (2013.01);
(Continued)

(58) Field of Classification Search
None
See application file for complete search history.

(56) References Cited

U.S. PATENT DOCUMENTS 7,105,904 B2   9/2006   Choi
7,534,645 B2   5/2009   Choi
(Continued)

FOREIGN PATENT DOCUMENTS

CN   1606158     4/2005
CN   101794768   8/2010
(Continued)

OTHER PUBLICATIONS

International Search Report dated Jul. 2, 2018 in International Application No. PCT/CN2018/082819.

*Primary Examiner* — Twyler L Haskins
*Assistant Examiner* — Dwight Alex C Tejano
(74) *Attorney, Agent, or Firm* — Wenderoth, Lind & Ponack, L.L.P.

(57) ABSTRACT

Provided are a camera module, a molding photosensitive assembly and manufacturing method thereof, and an electronic device. The molding photosensitive assembly comprises a molding portion, at least one photosensitive chip and at least one circuit board, wherein the photosensitive chip is provided on the circuit board, the molding portion comprises a molding portion main body, the molding portion main body is made of a transparent material, and the molding portion main body, the photosensitive chip and the circuit board form an integral structure by means of a molding technique, so as to facilitate production.

17 Claims, 12 Drawing Sheets

(51) Int. Cl.
*B29C 45/14* (2006.01)
*H01L 21/56* (2006.01)
*H04N 5/369* (2011.01)
*B29L 31/34* (2006.01)

(52) U.S. Cl.
CPC ...... *H01L 21/565* (2013.01); *H01L 27/14685* (2013.01); *H04N 5/2254* (2013.01); *H04N 5/369* (2013.01); *B29L 2031/3481* (2013.01); *H04N 5/2253* (2013.01)

(56) References Cited

U.S. PATENT DOCUMENTS

| | | | |
|---|---|---|---|
| 2004/0080642 A1* | 4/2004 | Kobayashi | H04N 5/2253 348/294 |
| 2004/0179249 A1* | 9/2004 | Hsieh | H01L 31/0203 358/505 |
| 2004/0251509 A1 | 12/2004 | Choi | |
| 2005/0074954 A1* | 4/2005 | Yamanaka | H01L 27/14643 438/458 |
| 2005/0077458 A1* | 4/2005 | Ma | H04N 5/2257 250/239 |
| 2006/0220025 A1* | 10/2006 | Oh | H01L 27/14636 257/72 |
| 2006/0270094 A1 | 11/2006 | Choi | |
| 2007/0222875 A1* | 9/2007 | Moriya | H01L 24/97 348/294 |
| 2007/0292127 A1* | 12/2007 | Kuhmann | H01L 27/14618 396/529 |
| 2009/0085138 A1* | 4/2009 | Ryu | H01L 27/14618 257/434 |
| 2011/0260035 A1* | 10/2011 | Seger | H01L 27/14618 250/208.1 |
| 2014/0183591 A1* | 7/2014 | Jow | H01L 27/14618 257/99 |
| 2017/0236860 A1 | 8/2017 | Yamamoto et al. | |
| 2017/0264801 A1* | 9/2017 | Wang | G02B 13/001 |
| 2017/0271389 A1 | 9/2017 | Yamamoto et al. | |
| 2018/0331142 A1 | 11/2018 | Yamamoto et al. | |

FOREIGN PATENT DOCUMENTS

| | | |
|---|---|---|
| CN | 103574520 | 2/2014 |
| CN | 105681637 | 6/2016 |
| CN | 105793988 | 7/2016 |
| JP | 56-103483 | 8/1981 |
| JP | 2004-180116 | 6/2004 |
| JP | 2005-5720 | 1/2005 |
| KR | 10-2004-0027351 | 4/2004 |
| KR | 10-2004-0106661 | 12/2004 |

* cited by examiner

CAMERA MODULE, MOLDING PHOTOSENSITIVE ASSEMBLY THEREOF, MANUFACTURING METHOD THEREOF AND ELECTRONIC DEVICE

FIELD OF THE PRESENT INVENTION

The present invention relates to the field of optical imaging, and in particular to a camera module, a molding photosensitive assembly thereof, a manufacturing method thereof and an electronic device.

BACKGROUND OF THE PRESENT INVENTION

For conventional molding, especially MOC (Molding on Chip), a photosensitive region of a chip needs to be strictly protected to avoid damage to a die or contamination by other substances, but in actual production, it is inevitable that defects will occur, eventually leading to product scrapping and cost loss.

Molding material used in the conventional molding is often opaque material, generally black. A conventional injection molding process uses nylon, LCP (Liquid Crystal Polymer), PP (Polypropylene), etc., and a molding process generally uses a resin. Although a molding photosensitive assembly made of these opaque materials can realize the protection of the photosensitive region of the chip, structure and process are often limited in producing the molding photosensitive assembly and the camera module, and in particular, an opening of a through hole is required to form a light window above the photosensitive region of the chip. Reliability of the products produced needs to be improved, the requirements for environment are also high, and the damage or contamination of the products in a poor environment affects the reliability of the products.

SUMMARY OF THE PRESENT INVENTION

An object of the present invention is to provide a camera module, a molding photosensitive assembly thereof, a manufacturing method thereof and an electronic device, and a molding portion main body of at least one molding portion of the molding photosensitive assembly is made of a transparent material.

Another object of the present invention is to provide a camera module, a molding photosensitive assembly thereof, a manufacturing method thereof and an electronic device, an outer surface of the molding portion main body is provided with at least one light shielding layer, and adjusting size and dimension of the light shielding layer can quickly adjust characteristics of a light entrance window such as size, position, shape, etc., so as to omit a complex process that requires die sinking for conventional methods of adjusting the light entrance window.

Another object of the present invention is to provide a camera module, a molding photosensitive assembly thereof, a manufacturing method thereof and an electronic device, at least one filter element can be directly attached above at least one photosensitive region of at least one photosensitive chip of the molding photosensitive assembly, adjustment of the filter element can be replaced by adjusting the size and the dimension of the light shielding layer.

Another object of the present invention is to provide a camera module, a molding photosensitive assembly thereof, a manufacturing method thereof and an electronic device, the molding portion being capable of completely wrapping the photosensitive chip and at least one circuit board of the molding photosensitive assembly, so as to omit step of protecting the photosensitive region, and reduce the cost while the yield and efficiency is improved.

Another object of the present invention is to provide a camera module, a molding photosensitive assembly thereof, a manufacturing method thereof and an electronic device, reliability of the camera module is further improved, and even a semi-finished product can be used in a relatively worse environment, and dirty or minor damage only needs to be directly wiped and cleaned, or the surface layer of the transparent material can be removed by physical means such as plasma process, polishing, etc.

Another object of the present invention is to provide a camera module, a molding photosensitive assembly thereof, a manufacturing method thereof and an electronic device, processing difficulty and time of die required for molding are greatly reduced, and difficulty of material filling during production is also significantly reduced, the efficiency is improved while the cost is reduced.

Another object of the present invention is to provide a camera module, a molding photosensitive assembly thereof, a manufacturing method thereof and an electronic device, different optical performances can be obtained by adjusting different thicknesses, different materials, or even different surface shapes of the molding portion main body above the photosensitive chip, which is equivalent to an whole piece of transparent material and the lens above to form a huge lens group together, providing more design space for design of the lens, and finally the camera module formed by assembling can obtain better optical performance and smaller outline dimension.

Another object of the present invention is to provide a camera module, a molding photosensitive assembly thereof, a manufacturing method thereof and an electronic device, at least one light passing region of the molding portion is covered with at least one filter layer or at least one light reflecting layer, which can have better transmittance and improve filter efficiency.

Another object of the present invention is to provide a camera module, a molding photosensitive assembly thereof, a manufacturing method thereof and an electronic device, light reflection, flash, and stray light can be reduced.

In order to achieve at least one of the above objects, the present invention provides a molding photosensitive assembly applied in at least one camera module, comprising:

a molding portion, wherein the molding portion comprises a molding portion main body, and the molding portion main body is made of transparent material; a photosensitive chip; and a circuit board, wherein the photosensitive chip is disposed on the circuit board;

wherein the molding portion main body of the molding portion, the photosensitive chip and the circuit board are formed into an integral structure by a molding process.

In some embodiments, the molding photosensitive assembly further comprises at least one light shielding layer, wherein the molding portion main body completely embeds the photosensitive chip and the circuit board, and the light shielding layer is covered on a part of an outer surface of the molding portion main body, and top of the molding portion main body further forms at least one light passing region, the light passing region corresponds to the photosensitive chip to provide a light path of the photosensitive chip.

In some embodiments, the light passing region of the molding portion is further covered with at least one filter layer or at least one light reflecting layer.

In some embodiments, edge of the filter layer or the light reflecting layer are overlapped with the edge of the light shielding layer.

In some embodiments, top of the molding portion main body of the molding portion has at least one groove, wherein the groove is recessed by a top surface of the molding portion main body, the light passing region is disposed in the groove.

In some embodiments, the molding portion further comprises at least one lens mounting section, wherein the lens mounting section is formed by extending upward from a periphery of the molding portion main body, and the lens mounting section and the molding portion main body are connected by integrally molding.

In some embodiments, the top of the molding portion is flat, that is, a top surface of the molding portion main body is flat, wherein the light passing region is defined on the flat top surface of the molding portion main body.

In some embodiments, the molding portion completely embeds the photosensitive chip.

In some embodiments, the molding portion main body is enveloped on the peripheral side and the bottom part of the light transmitting element, wherein the top surface of the light transmitting element and the top surface of the molding portion are in a same plane.

In some embodiments, at least one lead is further comprised, wherein the lead electrically connects the photosensitive chip and the circuit board, and the molding portion embeds the lead.

In some embodiments, at least one electronic component is further comprised, wherein the electronic component is disposed on the circuit board, and the molding portion also embeds the electronic component.

In some embodiments, the molding portion further comprises at least one molding portion main body and at least one light shielding layer, the light shielding layer is covered on a part of the outer surface of the molding portion main body, and the molding portion main body further forms at least one through hole corresponding to the photosensitive chip to provide a light path of the photosensitive chip.

In some embodiments, the bottom part of the through hole is inclined gradually from bottom to top.

In some embodiments, the molding photosensitive assembly further comprises a light transmitting element, wherein the molding portion supports the light transmitting element in the through hole for filtering light.

In some embodiments, the top of the molding portion is adapted to mount a lens, a driver or a filter element of at least one camera module.

In some embodiments, the top of the molding portion has a mounting groove, and the mounting groove is communicated with the through hole for mounting a filter element, a lens or a driver of at least one camera module.

In some embodiments, at least one electronic component is further comprised, wherein the electronic component is disposed on the circuit board, and the molding portion further embeds the electronic component.

In some embodiments, at least one lead is further comprised, wherein the lead electrically connects the photosensitive chip and the circuit board, and the molding portion further embeds a part or all of the lead.

In some embodiments, the photosensitive chip comprises a photosensitive region and a non-photosensitive region surrounding periphery of the photosensitive region, and the molding portion further embeds the non-photosensitive region of the photosensitive chip.

In some embodiments, the molding portion further comprises at least one lens mounting portion, the lens mounting portion and the molding portion main body are connected by integrally molding.

According to another aspect of the present invention, there also provides a camera module comprising at least one lens and one or more of the aforementioned molding photosensitive assemblies, the lens is located at an optical path of the photosensitive chip of the molding photosensitive assembly.

In some embodiments, at least one filter element is further comprised, wherein the filter element is supported by the molding portion and disposed between the lens and the molding photosensitive assembly.

In some embodiments, at least one filter element is further comprised, wherein the filter element is attached to the photosensitive chip.

In some embodiments, the camera module is a fixed focus camera module or a zoom camera module.

In some embodiments, the molding photosensitive assembly further comprises a supporting element, wherein the supporting element is disposed on the circuit board.

In some embodiments, the molding portion embeds the outer side of the supporting element.

In some embodiments, the supporting element embeds the lead.

According to another aspect of the present invention, there also provides a camera module comprising at least one lens and one or more of the aforementioned molding photosensitive assemblies, the lens is located at an optical path of the photosensitive chip of the molding photosensitive assembly, and the molding portion of the molding photosensitive assembly and the lens forms at least one lens group of the camera module.

According to another aspect of the present invention, there also provides an electronic device comprising one or more of the aforementioned camera modules, wherein each of the camera modules is for acquiring an image.

According to another aspect of the present invention, there also provides an array camera module comprising at least two lenses and at least two of the aforementioned molding photosensitive assemblies, each of the lenses is located at an optical path of each of the photosensitive chips of each of the molding photosensitive assemblies.

In some embodiments, at least two filter elements are further comprised, wherein each of the filter elements is supported by each of the molding portions and disposed between each of the lenses and each of the molding photosensitive assemblies.

In some embodiments, at least two filter elements are further comprised, wherein each of the filter elements is attached to each of the photosensitive chips.

In some embodiments, each of the camera modules is a fixed focus camera module or a zoom camera module.

According to another aspect of the present invention, there also provides an array camera module comprising at least two lenses and two of the aforementioned molding photosensitive assemblies, each of the lenses is located at an optical path of each of the photosensitive chips of each of the molding photosensitive assemblies, and the molding portions of the plurality of molding photosensitive assemblies are integrally molded.

According to another aspect of the present invention, there also provides an array camera module comprising at least one camera module as described above; and at least another camera module as described above, wherein the camera module and another camera module are disposed side by side, and the two adjacent camera modules are connected by integral molding by the molding portion.

In some embodiments, adjacent circuit boards are connected to form an integral circuit board.

In some embodiments, the adjacent circuit boards are disposed at intervals, wherein the molding portion fills the intervals of the adjacent circuit boards and connects the adjacent circuit board by integrally molding.

In some embodiments, adjacent light transmitting elements are connected to be formed an integrally.

According to another aspect of the present invention, an array camera module is further provided, comprising:

at least two lenses;

at least two photosensitive chips, wherein the lens is held in a corresponding photosensitive path of the photosensitive chip;

at least one circuit board, wherein the photosensitive chip is attached to the circuit board by an electrical connection; and a jointed molding portion, wherein the jointed molding portion, the circuit board, and the photosensitive chip are integrally molded by a molding process, and the jointed molding portion is made of a transparent material.

According to another aspect of the present invention, there also provides an electronic device comprising one or more of the aforementioned array camera modules, wherein each of the array camera modules is for acquiring an image.

DETAIL DESCRIPTION OF THE PRESENT INVENTION

Figure 1:
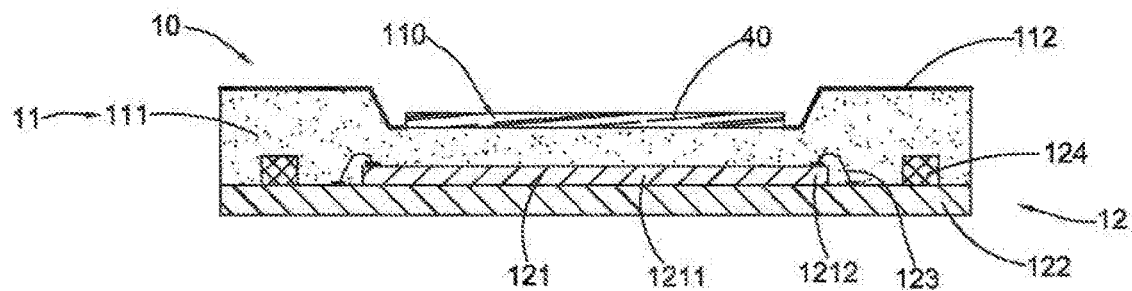
FIG. 1 is a stereoscopic diagram of a camera module, a molding photosensitive assembly thereof, a manufacturing method thereof, and an electronic device according to a preferred embodiment of the present invention.

The following description is presented to disclose the present invention to enable those skilled in the art to practice the present invention. The preferred embodiments in the following description are by way of example only, and other obvious variations will occur to those skilled in the art. The basic principles of the present invention as defined in the following description may be applied to other embodiments, modifications, improvements, equivalents, and other technical solutions without departing from the spirit and scope of the present invention.

It should be understood by those skilled in the art that in the disclosure of the present invention. The orientation or positional relationship of the indications of the terms "longitudinal", "transverse", "upper", "lower", "front", "back", "left", "right", "upright", "horizontal", "top", "bottom", "inside", "outside" and the like is based on the orientation or positional relationship shown in the drawings, which is merely for the convenience of describing the present invention rather than indicating or implying that the device or component referred to must have a particular orientation, constructed and operated in a particular orientation. Therefore, the above terms are not to be construed as a limitation of the present invention.

It will be understood that the term "a" should be understood as "at least one" or "one or more", that is, in one embodiment, the number of a element may be one, and in other embodiments, the number of a element can be multiple, and the term "a" cannot be construed as limiting the quantity.

Referring to FIG. 1 to FIG. 4 of the accompanying drawings, a molding photosensitive assembly and a camera module in accordance with a preferred embodiment of the present invention are illustrated. The molding photosensitive assembly 10 is used for assembly and manufacture of the camera module, and the molding photosensitive assembly 10 includes a molding portion 11 and a photosensitive portion 12. The molding portion 11 is connected to the photosensitive portion 12 by integrally molding.

A molding portion main body 111 of the molding portion 11 is made of a transparent material and can be completely covered on the surface of the photosensitive portion 12 for later forming a light shielding layer, a reflecting light layer, a light transmitting element, or the like on the surface of the molding portion main body 111.

The molding portion main body 111 of the present invention is made of a transparent material, and the transparent material used may be polymethyl methacrylate, polystyrene, polyester, polycarbonate, poly4-methylpentene-1, polyacrylate, transparent epoxy resin, APO resin, ZEONEX resin, ARTON resin, etc. It will be understood by those skilled in the art that the type of the aforementioned transparent materials is merely an example, and other transparent materials can be used, and the present invention is not limited in this respect.

The photosensitive portion 12 includes a photosensitive chip 121 and a circuit board 122, and the photosensitive chip 121 is disposed on the circuit board 122. According to this embodiment of the present invention, the photosensitive chip 121 is connected to the circuit board 122 by molding. That is, in this preferred embodiment of the present invention, the molding portion main body 111 made of a transparent material is molded to the photosensitive portion 12 in a manner of molding on chip, that is, a molding manner of MOC, so that the photosensitive chip 121 is attached to the circuit board 122. The basic concepts and basic processes of the MOC molding manner can be known to those skilled in the art, and will not be described herein.

The photosensitive portion 12 further includes a lead 123 and an electronic component 124. The lead 123 is electrically connected to the photosensitive chip 121 and the circuit board 122. The lead 123 can be specifically implemented as a gold wire, a copper wire, an aluminum wire, a silver wires or the like in various embodiments of the present invention. It can be understood by those skilled in the art that the lead 123 is implemented as a gold wire, a copper wire, an aluminum wire, a silver wire or the like by way of example only. The present invention may have other reasonable implementation manners in other embodiments. The present invention is not limited in this respect. The photosensitive portion 12 further includes a connection line not shown in the drawings, the connection line is preset to the circuit board 122, and the electronic component 124 is connected to the connection line and the photosensitive chip 121. Therefore, the photosensitive chip 121 can perform photosensitive operation. That is, the electronic component 124 is electrically connected to the circuit board 122 and the photosensitive chip 121.

The electronic component 124 is disposed to protrude from the circuit board 122 in a preferred embodiment of the present invention. The electronic component 124 can be implemented as a resistor, a capacitor, a diode, a triode, a potentiometer, a relay, a driver or the like in various embodiments of the present invention. It can be understood by those skilled in the art that the electronic component 124 is implemented as a resistor, a capacitor, a diode, a triode, a potentiometer, a relay, a driver or the like by way of example, the present invention may have other reasonable implementation manners in other examples. The present invention is not limited in this respect. It can be understood by those skilled in the art that in the embodiment of the present invention, taking the electronic component 124 protruding from the circuit board 122 as an example for description, and in other embodiments of the present invention, the electronic component 124 can be embedded in the circuit board 122 without protruding from the circuit board 122. It will be understood by those skilled in the art that the shape, type, and location of the electronic component 124 are not limitations of the present invention.

The molding portion main body 111 made of a transparent material in the preferred embodiment of the present invention embeds the lead 123 and the electronic component 124 therein, preferably, the molding portion main body 111 completely embeds the lead 123 and the electronic component 124, so that the lead 123 and the electronic component 124 are not directly exposed to the space, thereby when the molding photosensitive assembly 10 is assembled to form the camera module, dust and debris are prevented from staying on the surface of the electronic component 124 by molding and embedding of the electronic component 124. The leads 123 can also be protected during the molding process and subsequent assembly and operation.

The photosensitive chip 121 includes a photosensitive region 1211 and a non-photosensitive region 1212, wherein the photosensitive region 1211 and the non-photosensitive region 1212 of the photosensitive chip 121 are integrally molded, and the photosensitive region 1211 is located in the center of the photosensitive chip 121, the non-photosensitive region 1212 is located at outer side of the photosensitive chip 121, and the non-photosensitive region 1212 surrounds at least one side of the photosensitive region 1211. Light reflected or emitted by an object can be received and photo-electrically converted by the photosensitive region 1211 of the photosensitive chip 121 through the molding portion main body 111 made of a transparent material to obtain an image associated with the object.

It is to be noted that, in this preferred embodiment of the present invention, the molding portion main body 111 made of a transparent material preferably embeds the upper surface of the photosensitive chip 121 completely. That is, preferably, the molding portion 11 embeds the photosensitive region 1211 and the non-photosensitive region 1212 of the photosensitive chip 121. The molding portion main body 111 made of a transparent material can completely embed the photosensitive chip 121 and the circuit board 122 in this preferred embodiment of the present invention, so that a step of protecting the photosensitive region 1211 of the photosensitive chip 121 can be omitted, and the cost is reduced while yield and efficiency are increased.

Further, the molding portion main body 111 made of a transparent material can form a light shielding layer on the surface of the transparent material after completely embedding on the upper surface of the photosensitive chip 121. That is, the molding photosensitive assembly 10 further includes a light shielding layer 112. The light shielding layer 112 is disposed on an outer surface of the molding portion main body 111. In this preferred embodiment of the present invention, the light shielding layer 112 does not cover the region above the photosensitive region 1211. That is, in this preferred embodiment of the present invention, a region of the outer surface of the molding portion main body 111 without the light shielding layer 112 forms a light passing region 110 of the molding portion 11, the light passing region 110 is defined by the light shielding layer 112 to the molding portion 11, and corresponds to the photosensitive region 1211, so that the light at outside and reflected by the object can be passed through the light passing region 110 of the molding portion 11, received and photo-electrically converted by the photosensitive region 1211 of the photosensitive chip 121 to obtain an image associated with the object.

It will be understood by those skilled in the art that in the preferred embodiment of the present invention, the outer surface of the molding portion main body 111 is covered by the light shielding layer 112 except for the light passing region 110. By way of example, there are other reasonable implementation manners in other embodiments. In other words, it will be understood by those skilled in the art that the disposing position of the light shielding layer 112 on the outer surface of the molding portion main body 111 of the molding portion 11 is adjusted according to actual needs without affecting the reception and photoelectric conversion of the photosensitive region 1211. The size and the dimension of the light shielding layer 112 can also be adjusted according to actual needs.

In addition, it is to be noted that adjusting the size and dimension of the light shielding layer 112 can quickly adjust the characteristics of light entrance window, that is, the characteristics of the light passing region 110, such as the size, position, shape, etc., so as to omit the complex process that requires die sinking for conventional methods to adjust the light entrance window.

It is to be noted that the molding portion main body 111 made of a transparent material can further improve the reliability of the camera module formed by assembly, even if the semi-finished product, such as the molding photosensitive 10 formed by assembly or the like, can be used in a relatively worse environment. When dirt or slight damage occurs, it is only necessary to directly wipe and clean, or to remove the surface layer of the molding portion 11 by physical means such as plasma process, polishing, etc.

Figure 4:
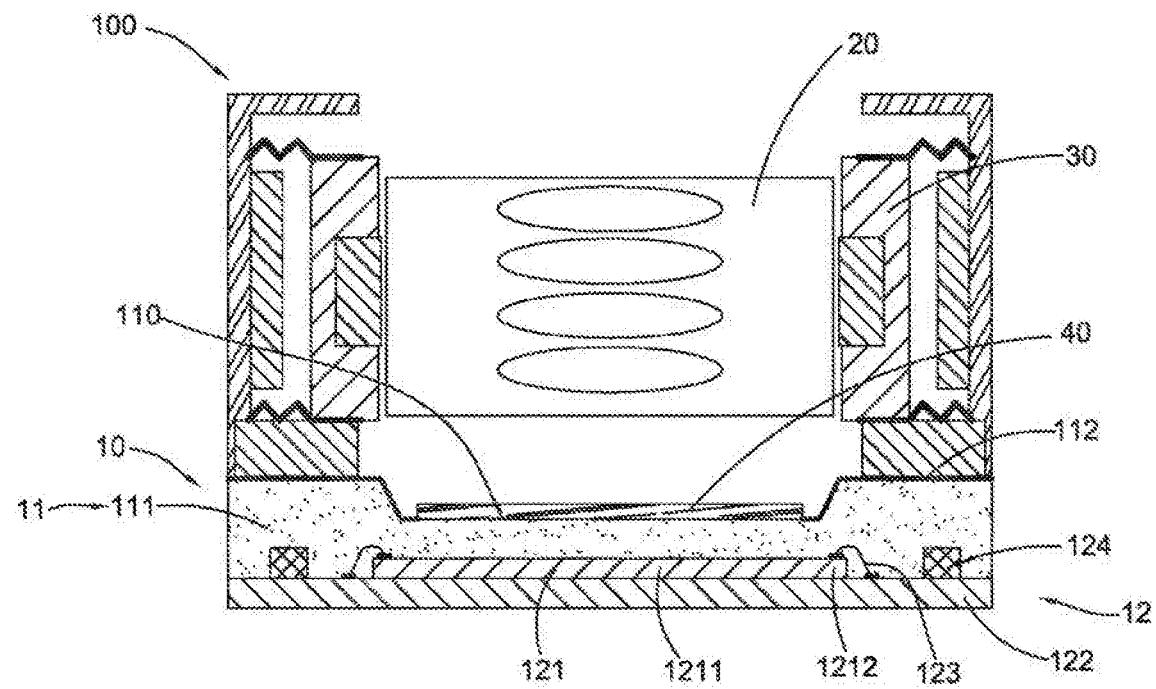
FIG. 4 is a stereoscopic diagram of the camera module according to the above embodiments of the present invention.

As shown in FIG. 4, a camera module 100 assembled and manufactured based on the molding photosensitive assembly 10 of this preferred embodiment of the present invention is described, wherein the camera module 100 includes the molding photosensitive assembly 10 and a lens 20. The lens 20 is disposed and support on a photosensitive path of the photosensitive element 21 of the molding photosensitive assembly 10. Light reflected by the object enters the inside of the camera module 100 from the lens 20 to be subsequently received and photo-electrically converted by the photosensitive chip 121 of the molding photosensitive assembly 10, thereby obtaining an image associated with the object.

In addition, a preferred embodiment of the present invention uses a MOC molding process, and the camera module 100 is implemented as a zoom camera module. The camera module 100 further includes a driver 30 that can drive the lens 20 to move back and forth along the photosensitive path of the photosensitive chip 121 to adjust the focal length of the camera module 100. In other words, the lens 20 is drivably disposed and supported on the driver 30. It is to be noted that the type of the driver 30 is not limited in the camera module 100 of the present invention. For example, in another embodiment, the driver 30 can be implemented as any driver capable of driving the lens 20 to move along the photosensitive path of the photosensitive element 21, such as a voice coil motor or the like, wherein the driver 30 is capable of receiving electrical energy and control signals to be in an operational state.

It can be understood by those skilled in the art that in other embodiments, the camera module 100 is implemented as a fixed focus camera module. That is, when the camera module 100 is implemented as a fixed focus camera module, the molding portion 11 is implemented to be a lens holder that assembles the lens 20 in a variant embodiment, and the lens 20 is directly mounted on the molding portion 11 implemented as a lens holder after the molded photosensitive assembly 10 is integrally molded, thereby simplifying the assembly process of the camera module 100.

Further, as shown in FIG. 1 and FIG. 4, the camera module 100 further includes at least one filter element 40, and the filter element 40 is located in an optical path of the lens 20. In this preferred embodiment of the present invention, after the molding photosensitive assembly 10 is molded, the filter element 40 is attached to the top of the molding portion 11 of the molding photosensitive assembly 10, to assemble and form the camera module 100. The filter element 40 is located in the photosensitive path of the photosensitive chip 121. The light reflected by the object is from each of optical lenses of the lens 20 and filtered by the filter element 40 to enter the inside of the camera module 100, and can be received and photo-electrically converted by the photosensitive element 21. That is, the filter element 40 is capable of filtering stray light, such as an infrared portion or a visible portion, in the light reflected by the object from each of the optical lenses of the lens 20, in this way, the image quality of the camera module 100 can be improved.

Specifically, in this preferred embodiment of the present invention, the filter element 40 is located in an optical path of the lens 20, and the filter element 40 is disposed in the light passing region 110 of the molding portion 11. That is, the portion where the molding portion main body 111 of the molding portion 11 and the bottom portion of the filter element 40 are in contact with each other is not provided with the light shielding layer 112. It is to be noted that, in this preferred embodiment of the present invention, the filter element 40 is directly attached to the molding portion 11 and is located directly above the photosensitive region 1211 of the photosensitive chip 121.

Since the size of the light shielding layer 112 can be adjusted, compared with the conventional technology, an additional small lens holder is no longer needed to help limit the size of the filter element 40, as long as the light shielding layer 112 is adjusted.

Further, the top surface of the molding portion 11 is recessed to form a groove, and the light passing region 110 is defined on the bottom surface of the groove, corresponding to the photosensitive region 1211. The filter element 40 covers the light through region 110 for filtering light. Preferably, in the embodiment, the groove is gradually reduced from top to bottom, on one hand, the size of the filter element 40 is reduced, and on the other hand, a certain drafting angle is formed, thereby reducing the resistance during the process of drafting the die.

It will be understood by those skilled in the art that in different examples of the camera module 100, the filter elements 40 can be implemented in different types, for example, the filter elements 40 can be implemented as infrared cut filter element, full transmissive spectral filter element, and other filter elements or a combination of multiple filter elements, for example, the filter element 40 can be implemented as a combination of an infrared cut filter element and a full transmissive spectral filter element, that is, the infrared cut filter element and the full transmissive spectral filter element can be switched to be selectively located on the photosensitive path of the photosensitive element 21, for example, when the camera module 100 is used in an environment where the light is sufficient during the daytime, the infrared cut filter element may be switched to the photosensitive path of the photosensitive chip 121 to filter infrared rays of the light entering the camera module 100 reflected by an object through the infrared cut filter element. When the camera module 100 is used in a dark environment such as at night, the full transmissive spectral filter element can be switched to the photosensitive path of the photosensitive chip 121 to allow the transmission of the infrared part of the light entering the camera module 100 reflected by an object.

Figure 5:
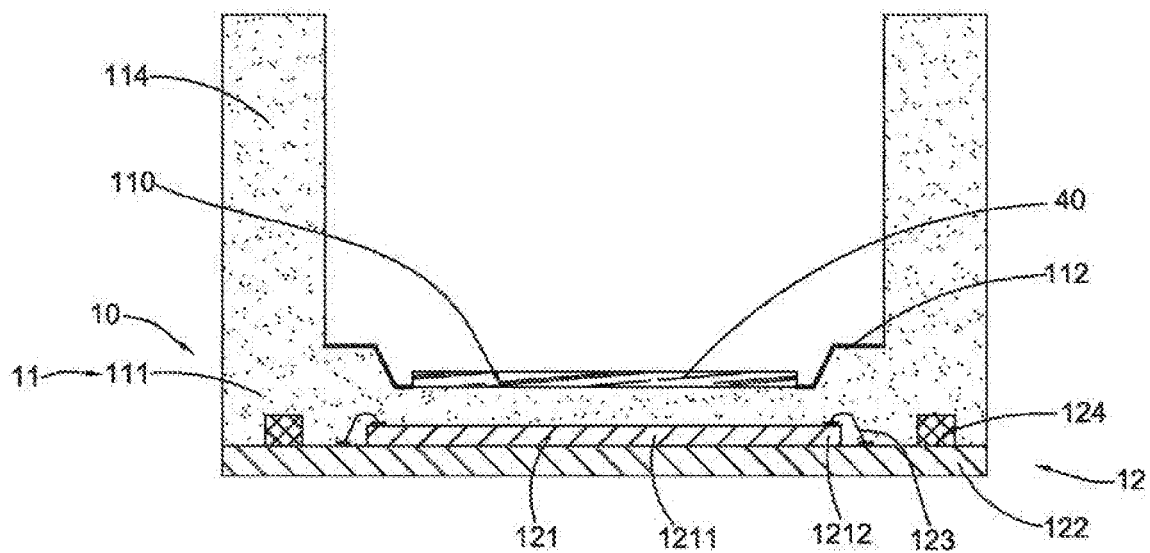
FIG. 5 is a stereoscopic diagram of another variant embodiment of the molding photosensitive assembly according to the above embodiments of the present invention.

Another variant embodiment of the molding portion 11 based on the preferred embodiment shown in FIG. 1 is shown in FIG. 5. Unlike the molding portion 11 in the embodiment described in FIG. 1, in FIG. 5, the molding portion 11 further includes a lens mounting section 114. That is, in this embodiment, the molding portion 11 includes the molding portion main body 111 and the lens mounting section 114. The light shielding layer 112 is disposed on the outer surface of the lens mounting section 114 in addition to the outer surface of the molding portion main body 111, according to actual needs. The molding portion main body 111 and the lens mounting section 114 are integrally molding and connected in order. The lens mounting section 114 is for mounting the lens 20 (the lens 20 is not shown in FIG. 5), that is, when the molding photosensitive assembly 10 is used to assemble a camera module, the lens 20 is mounted at inner side of the lens mounting section 114 so as to provide a stable mounting position for the lens 20. The lens mounting section 114 is formed by integrally extending upwardly of the periphery of the molding portion main body 111 to provide a support fixed position for the lens 20, thereby eliminating the need to provide additional components to mount the lens 20. In other words, the molding portion 11 integrally extends upwardly and has a stepped shape internally to mold the circuit board 122, the photosensitive chip 121, the lead 123, the electronic component 124, respectively, and support the lens 20.

It is to be noted that an inner side surface of the lens mounting section 114 is flat, so as to be suitable for mounting the unthreaded lens 20 to form a fixed focus module. In particular, the lens 20 can be fixed to the lens mounting section 114 by adhering. It is also to be noted that the lens 20 is mounted on the lens mounting section 114, so that the molding portion 11 functions as a bracket or a lens barrel in a conventional camera module to provide support, fixed position for the lens 20, the molding portion 11 replaces the conventional bracket and provides the mounting position for the lens 20, which avoids the tilt error caused by the bracket during adhering and assembling, and reduces the cumulative tolerance of the assembly of the camera module.

Figure 6:
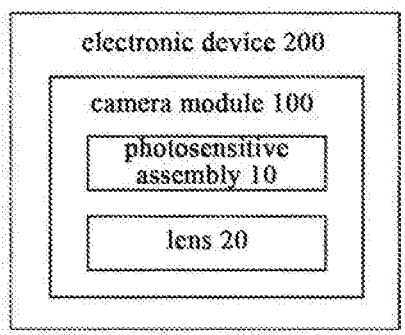
FIG. 6 is a block diagram of an electronic device according to the above embodiments of the present invention.
Figure 7:
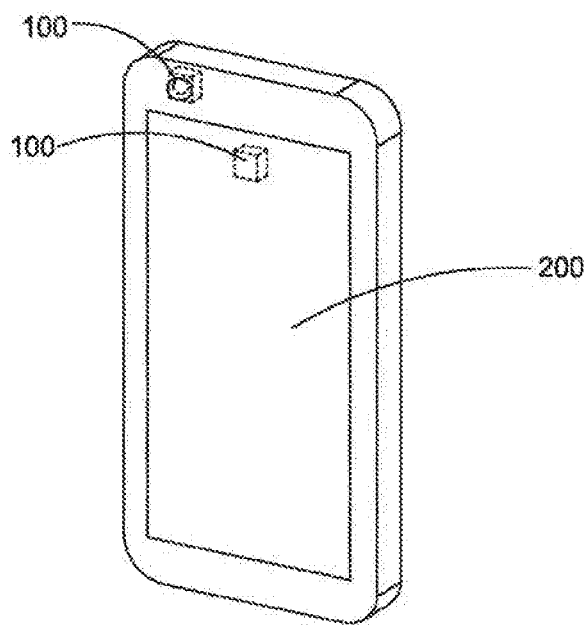
FIG. 7 is a stereoscopic diagram of the electronic device.

As shown in FIG. 6 and FIG. 7, the camera module 100 formed by assembling the molding photosensitive assembly of the present invention can be disposed on an electronic device body 200. That is, the electronic device body 200 includes at least one camera module 100, wherein each of the camera modules 100 is for acquiring images, wherein each of the camera modules 100 further includes the lens 20 and the molding photosensitive assembly 10.

It is to be noted that the camera module 100 can be disposed on the back side of the electronic device body 200, that is, on the side opposite to the display screen of the electronic device body 200. The camera module 100 can also be is disposed on the front side of the electronic device body 200, that is, on the side of the display screen of the electronic device body 200, or at least one of the camera modules 100 is disposed on the back side of the electronic device body 200, and at least one of the camera module 100 is disposed on the front side of the electronic device body 200. Of course, those skilled in the art can understand that in other embodiments, the camera module 100 can also be disposed on the side face of the electronic device body 200, and the present invention is not limited in this respect.

Figure 12:
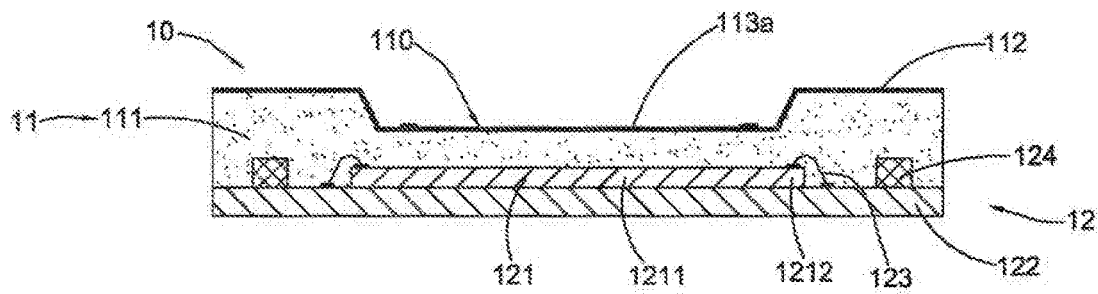
FIG. 12 is a stereoscopic diagram of another embodiment of the molding photosensitive assembly based on the above embodiments of the present invention.

FIG. to FIG. 12 show variant embodiments of the molding portion 11 of a preferred embodiments of the present invention, in which the molding photosensitive assembly 10A, 10B, 10C, or 10D respectively includes a light shielding layer 112A, 112B, 112C, and 112D; a molding portion 11A, 11B, 11C, or 11D; and a photosensitive portion 12A, 12B, 12C, or 12D, wherein the molding portion 11A, 11B, 11C, or 11D respectively covers the surfaces of the photosensitive portion 12A, 12B, 12C, or 12D, the light shielding layer 112A, 112B, 112C, or 112D is respectively attached to the outer surfaces of the molding portion 11A, 11B, 11C, or 11D.

Figure 8:
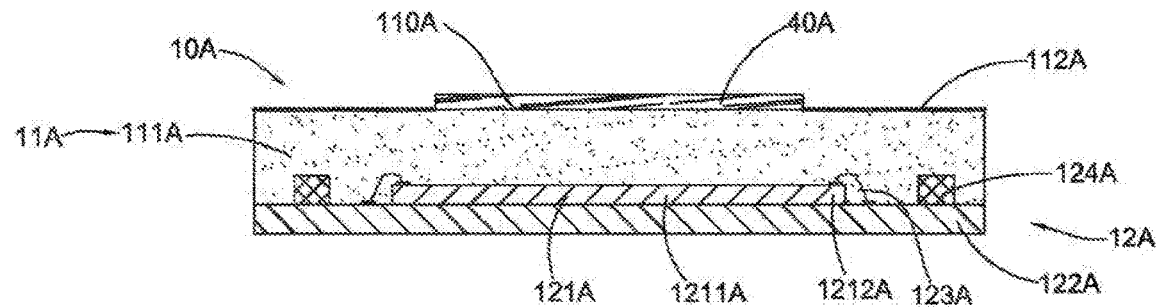
FIG. 8 is a stereoscopic diagram of another embodiment of the molding photosensitive assembly based on the above embodiments of the present invention.

The photosensitive portion 12A, 12B, 12C, or 12D respectively includes a photosensitive chip 121A, 121B, 121C, or 121D; a circuit board 122A, 122B, 122C, or 122D; a lead 123A, 123B, 123C, or 123D; and an electronic component 124A, 124B, 124C, or 124D. The molding portion 11A, 11B, 11C, or 11D respectively includes a molding portion main body 111A, 111B, 111C, or 111D. The photosensitive chip 121A, 121B, 121C, or 121D respectively has a photosensitive region 1211A, 1211B, 1211C, or 1211D; and a non-photosensitive region 1212A, 1212B, 1212C, or 1212D. As shown in FIG. 8, another variant embodiment of the molding portion 11 based on the preferred embodiment of the present invention is described. The difference from the above preferred embodiment is that the top of the molding portion 11A is a flat surface. Therefore, the manufacturing difficulty of the die is lowered. Since the drop between the top mounting surface of the molding portion 11A and the photosensitive surface of the photosensitive chip 121A is no longer required to be realized by the die, the die only needs to provide a small surface drop to achieve the same structural requirements, the difficulty and time of processing of the die are greatly reduced, and the difficulty of material filling during production is also significantly reduced, which greatly contributes to the improvement of efficiency and the reduction of cost.

That is, the light passing region 110A is defined by the light shielding layer 112A on the flat top mounting surface of the molding portion main body 111A, corresponding to the photosensitive region 1211A of the photosensitive chip 121A. Accordingly, the light transmitting element 40A covers the light passing region 110A and is attached to the flat top mounting surface of the molding portion main body 111A.

Figure 9:
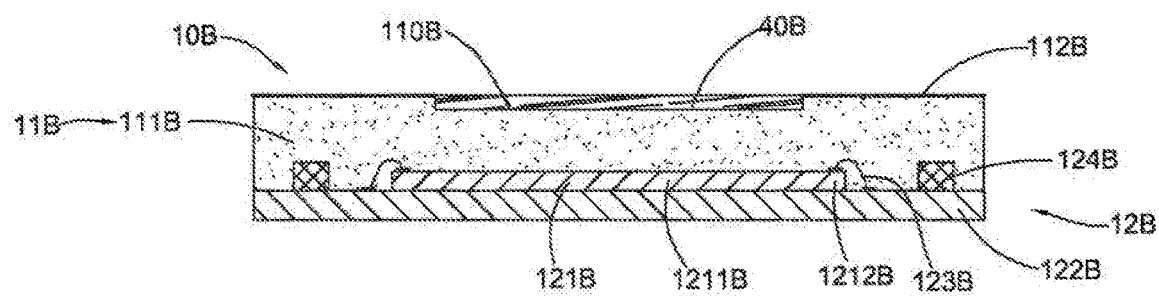
FIG. 9 is a stereoscopic diagram of another embodiment of the molding photosensitive assembly based on the above embodiments of the present invention.

As shown in FIG. 9, another variant embodiment of the molding portion 11 based on the preferred embodiment of the present invention is described. In order to facilitate attachment of the filter element 40B, the light passing region 110B of the top mounting surface of the molding portion 11B extends downward inwardly to form a filter element mounting groove, as compared with the molding portion 11A of FIG. 8, the filter element 40B is mounted in the filter element mounting groove, and the upper surface of the filter element 40B and the top mounting surface of the molding portion 11B disposed with the light shielding layer 112B are in a same plane. Thus, with respect to the embodiment in FIG. 8, the filter element 40B in the embodiment of FIG. 9 does not protrude from the molding portion main body 111B of the molding portion 11B.

That is, the groove is implemented as the filter element mounting groove. The light passing region 110B is defined as a bottom surface of the filter element mounting groove, and the filter element 40B is mounted to the filter element mounting groove. At this time, the molding portion main body 111B embeds on the peripheral side and the bottom surface of the light transmitting element 40B, wherein the top surface of the light transmitting element 40B and the top mounting surface of the molding portion 11B are in a same plane.

Figure 10:
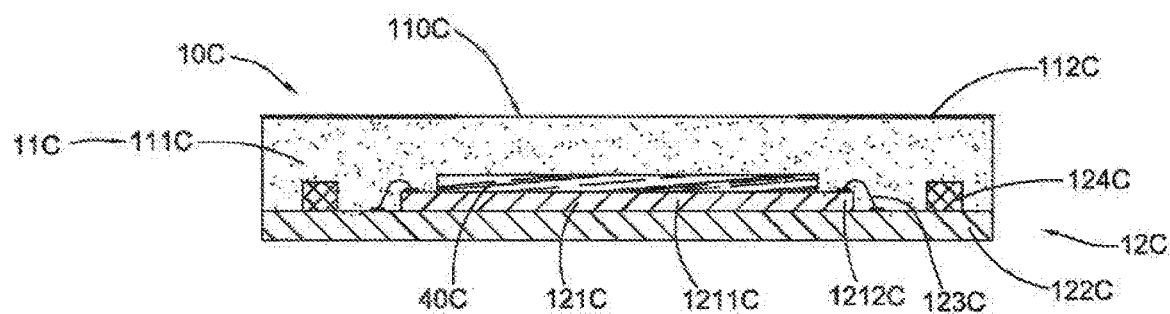
FIG. 10 is a stereoscopic diagram of another embodiment of the molding photosensitive assembly based on the above embodiments of the present invention.

As shown in FIG. 10, another variant embodiment of the molding portion 11 based on the preferred embodiment of the present invention is described. The mounting position of the filter element 40C is different from that of the molding portion 11A in FIG. 8. In the embodiment shown in FIG. 10, the filter element 40C is attached on the photosensitive chip 121C. That is, at the time of molding, the molding portion 11C formed by molding completely embeds the filter element 40C and the photosensitive chip 121C of the photosensitive portion 12C. Thus, the filter element mounting groove in which the filter element 40B is mounted is not additionally formed on the top surface of the molding portion 11B as in the embodiment of FIG. 9. Therefore, the processing difficulty and processing time of the die are further reduced, and the difficulty of material filling during production is also significantly reduced, which greatly contributes to the improvement of efficiency and the reduction of cost.

That is, the light passing region 110A is defined by the light shielding layer 112A on the flat top mounting surface of the molding portion main body 111A, corresponding to the photosensitive region 1211A of the photosensitive chip 121A. The molding portion main body 111C embeds the filter element 40C on the photosensitive chip 121C, and embeds the photosensitive chip 121C, the circuit board 122C, the leads 123C and/or the electronic component 124C.

The mounting position of the filter element 40 has various variant implementation manners in different embodiments. The filter element 40C described in FIG. 10 is attached to the photosensitive chip 121C. The filter element 40C and the photosensitive assembly 20C are molded and assembled together in the die. In other embodiments, such as the embodiment of FIG. 1 and FIG. 8, the filter elements 40, 40A are disposed on top of the molding portions 11, 11A, and the filter element 40, 40A is mounted after the molding photosensitive assembly 10, 10A is integrally molded.

It will be understood by those skilled in the art that the filter element 40C described in the embodiment shown in FIG. 10 is attached to the photosensitive element 121C, and the variant implementation of the filter element 40C being embedded by the molding portion 11C can also be applied to the embodiment in FIG. 1 and FIG. 5, which belongs to a variant embodiment of the different mounting positions of the filter element 40.

Of course, other implementation may be used in other embodiments, and the present invention is not limited in this respect.

Figure 11:
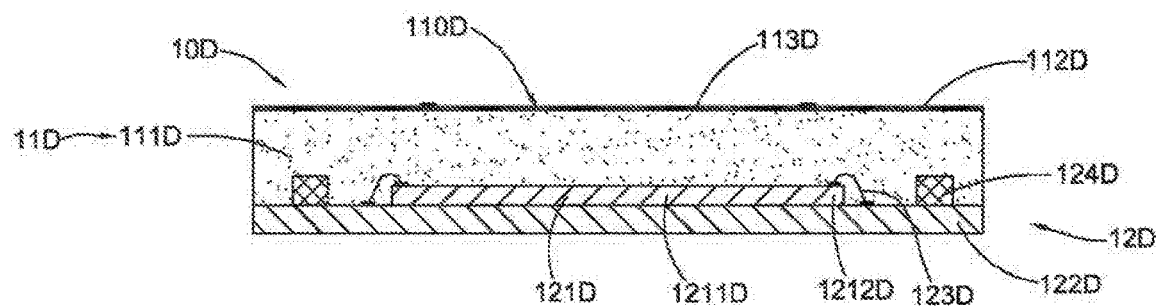
FIG. 11 is a stereoscopic diagram of another embodiment of the molding photosensitive assembly based on the above embodiments of the present invention.

As shown in FIG. 11, another variant embodiment of the molding portion 11 based on the preferred embodiment of the present invention is described. Further, with respect to the embodiment of FIG. 8, the filter element 40A is omitted, it is only necessary to allow the filter coating which functions as a filter to directly form a filter layer 113D in the non-light shielding region, that is, the light passing region 110D of the molded portion 11D, that is, the filter element 40A may be implemented as the filter layer 113D. The organic material used for the molding material has a better transmittance than the inorganic glass substrate material used in the conventional filter element 40, and the filter efficiency can be improved to some extent.

It is to be noted that contacting edges of the light shielding layer 112D and the filter layer 113D overlap each other to prevent the full spectrum light from directly entering the photosensitive region 1211D of the photosensitive chip 121D. It can be understood by those skilled in the art that the light shielding layer 112D may be above the filter layer 113D or below the filter layer 113D. As shown in FIG. 12, another variant embodiment of the molding portion 10 based on the preferred embodiment of the present invention is described. Further, with respect to the embodiment of FIG. 1, the filter element 40 is omitted, and it is only necessary to allow light absorbing material which functions as a filter to directly form a light reflecting layer 113a in the non-light shielding region, that is, the light passing region 110 of the molding portion 11, and the light reflecting layer 113a intensively reflects light of a specified wavelength, such as infrared light or visible light. Similarly, the organic material used for the molding material has a better transmittance than the inorganic glass substrate material used in the conventional filter element 40, and the filter efficiency can be improved to some extent. It is to be noted that the contact edges of the light shielding layer 112 and the light reflecting layer 113a overlap each other to prevent the full spectrum light from directly entering the photosensitive region 1211 of the photosensitive chip 121. The light shielding layer 112 may be above the light reflecting layer 113a or below the light reflecting layer 113a.

It can be understood by those skilled in the art that the light reflecting layer 113a can also be implemented in the embodiment shown in FIG. 11 instead of the filter layer 113D of the embodiment in FIG. 11. Of course, other implementations are possible in other embodiments, and the present invention is not limited in this respect.

Figure 13:
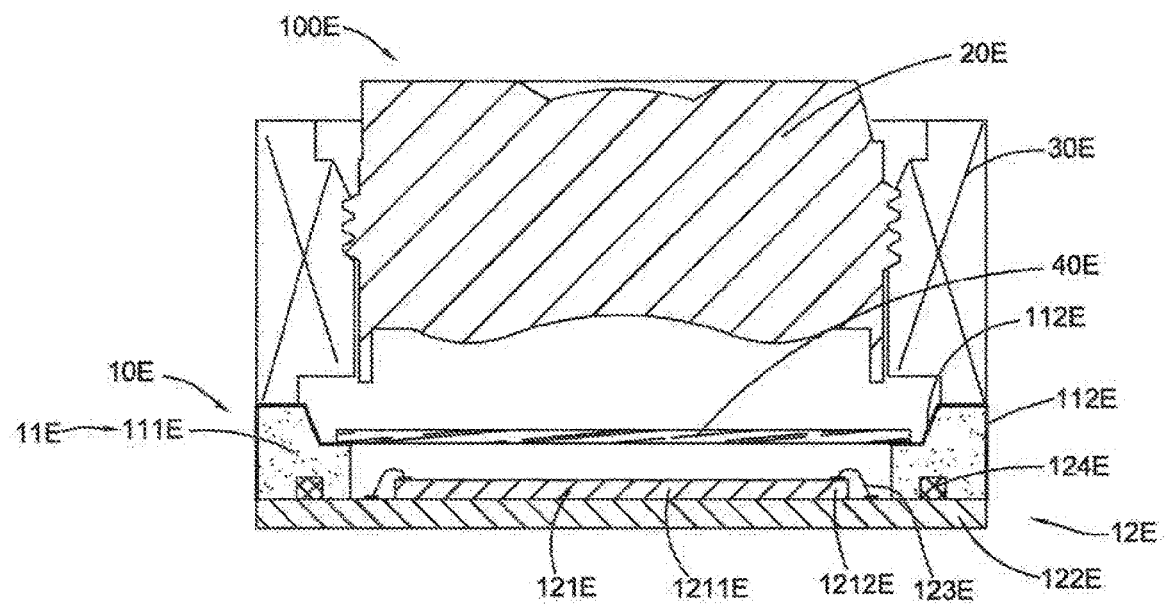
FIG. 13 is a stereoscopic diagram of another embodiment of the molding photosensitive assembly based on the above embodiments of the present invention.
Figure 14:
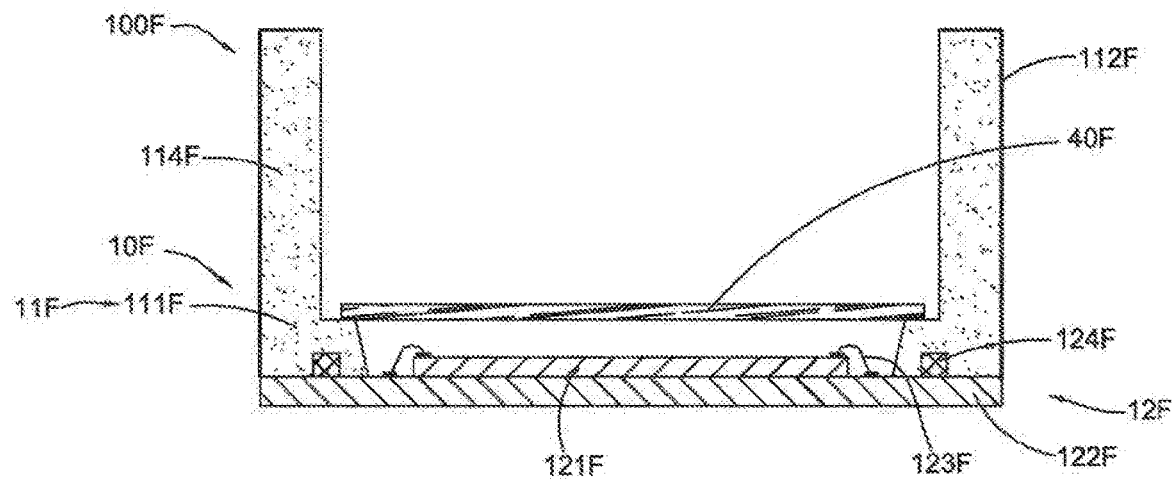
FIG. 14 is a stereoscopic diagram of another embodiment of the molding photosensitive assembly based on the above embodiments of the present invention.
Figure 15:
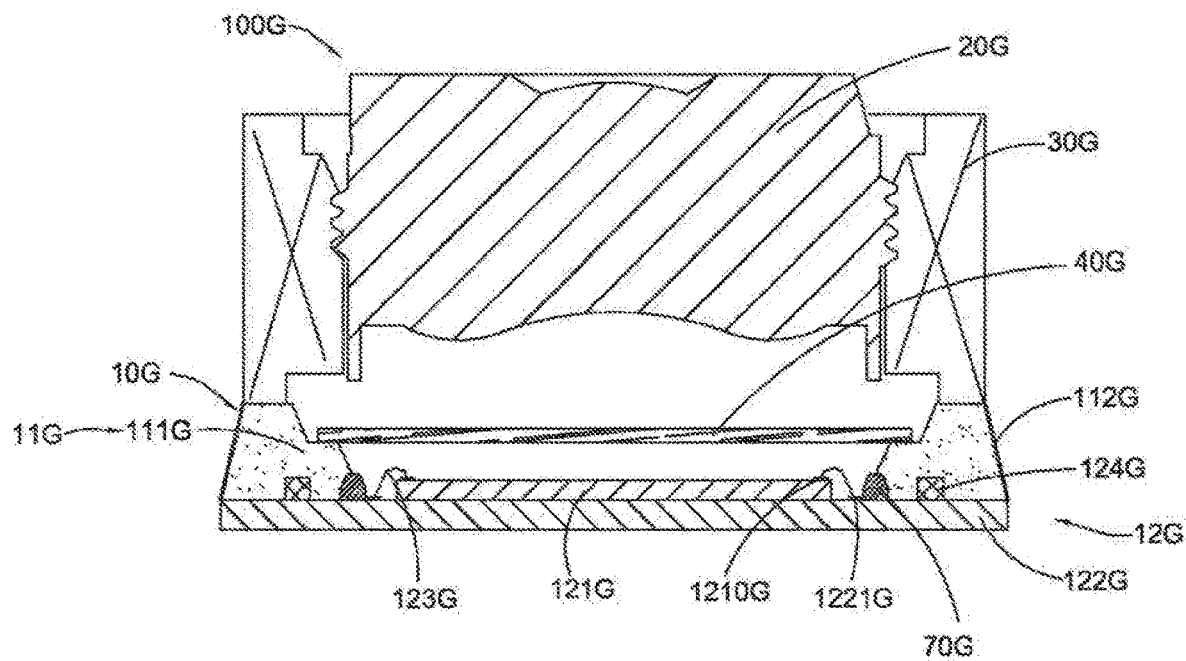
FIG. 15 is a stereoscopic diagram of another embodiment of the camera module according to the above embodiments of the present invention.

The various embodiments shown in FIGS. 1 to 12 are all use MOC processes. As shown in FIG. 13, FIG. 14, and FIG. 15, the camera modules 100E, 100F, and 100G are based on the MOB process, the shape and structure of the molding portion 11 and the variant implementation thereof are same as the molding portion 11 and the variants of the MOB process disclosed by the inventors in other patent documents, except that in the embodiment shown in FIG. 13, the molding portion main body 111E is made of a transparent material, and the material of the molding portion 11 and the variants of the MOB process disclosed by the inventors in other patent documents is non-transparent materials. The replacement of this material can also have the advantages of the MOC molding process described above. In addition, it is also possible to reduce reflection of light, flash, and stray light.

As shown in FIGS. 13 to 15, the molding photosensitive assembly 10E, 10F, or 10G respectively includes a molding portion 11E, 11F, or 11G, and a photosensitive portion 12E, 12F, or 12G, the photosensitive portion 12E, 12F, or 12G includes a photosensitive chip 121E, 121F, or 121G, and a circuit board 122E, 122F, or 122G. The photosensitive chip 121E, 121F, or 121G is respectively disposed on the circuit board 122E, 122F, or 122G, and the molding portion 11E, 11F, or 11G, the photosensitive chip 121E, 121F, or 121G, the circuit board 122E, 122F, or 122G are integrally formed by a molding process, respectively.

The molding portion 11E, 11F, or 11G, further include at least one molding portion main body 111E, 111F, or 111G, respectively. The photosensitive assembly 10E, 10F, or 10G further includes at least one light shielding layer 112E, 112F, or 112G, respectively, the light shielding layer 112E, 112F, or 112G is respectively covered on a part of an outer surface of the molding portion main body 111E, 111F, or 111G, and the molding portion main body 111E, 111F, or 111G further forms at least one through hole, respectively, corresponding to the photosensitive chip 121E, 121F, or 121G to provide light path of the photosensitive chip 121E, 121F, or 121G. The bottom of the through hole has an inclined shape which gradually increases from bottom to top. The molding portion main body 111E, 111F, or 111G is made of a transparent material.

The top of the molding portion 11E, 11F, or 11G is adapted to mount a lens, a driver or a filter element of at least one camera module. The molding photosensitive assembly 10E, 10F, or 10G further includes at least one electronic component 124E, 124F, or 124G, respectively, the electronic component 124E, 124F, or 124G is respectively disposed on the circuit board 122E, 122F, or 122G, the molding portion 11E, 11F, or 11G also respectively embeds the electronic component 124E, 124F, or 124G. The molding photosensitive assembly 10E, 10F, or 10G further includes at least one lead 123E, 123F, or 123G, respectively, the lead 123E, 123F, or 123G electrically connects to the photosensitive chip 121E, 121F, or 121G and the circuit board 122E, 122F, or 122G, respectively, the molding portion 11E, 11F, or 11G also respectively embeds a part or all of the lead 123E, 123F, or 123G.

In still other embodiments of the present invention, the molding portion 11E further embeds the non-photosensitive region 1212E of the photosensitive chip 121E. That is, the non-photosensitive region 1212E is protected by the molding portion main body 111E made of a transparent material, and the photosensitive region 1211E of the photosensitive chip 121E is exposed to receive a light conversion signal. The light transmitting element 40E, 40F is supported by the molding portion in the through hole for filtering light and forming a sealed space to prevent dust from contaminating the photosensitive region 1211E.

In addition, in other embodiments, the top of the molding portion 11E has a mounting groove, and the mounting groove is communicated with the through hole for mounting the filter elements 40E, 40F or 40G of the at least one camera module; a lens 20E or 20G, or a driver 30E or 30G, as shown in FIG. 13 and FIG. 15.

As shown in FIG. 14, which is different from FIG. 13 in that, the molding portion 11F further includes at least one lens mounting section 114F, and the lens mounting section 114F and the molding main body 111F are connected by integrally molding, that is, the lens mounting section 114F is formed by extending upward of a periphery of the molding portion main body 111F. The lens mounting section 114F is used to mount a lens of at least one camera module.

Figure 2:
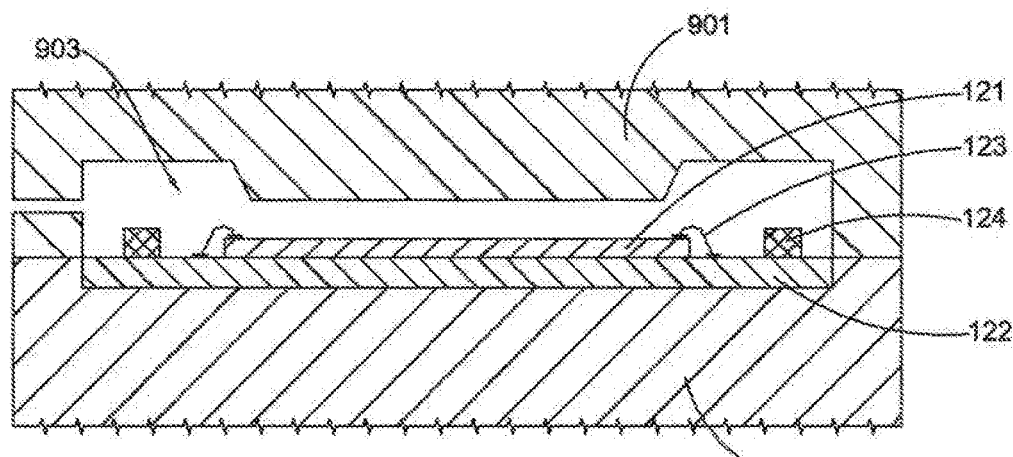
FIG. 2 is a schematic view showing manufacture of the molding photosensitive assembly according to the above embodiments of the present invention.
Figure 3:
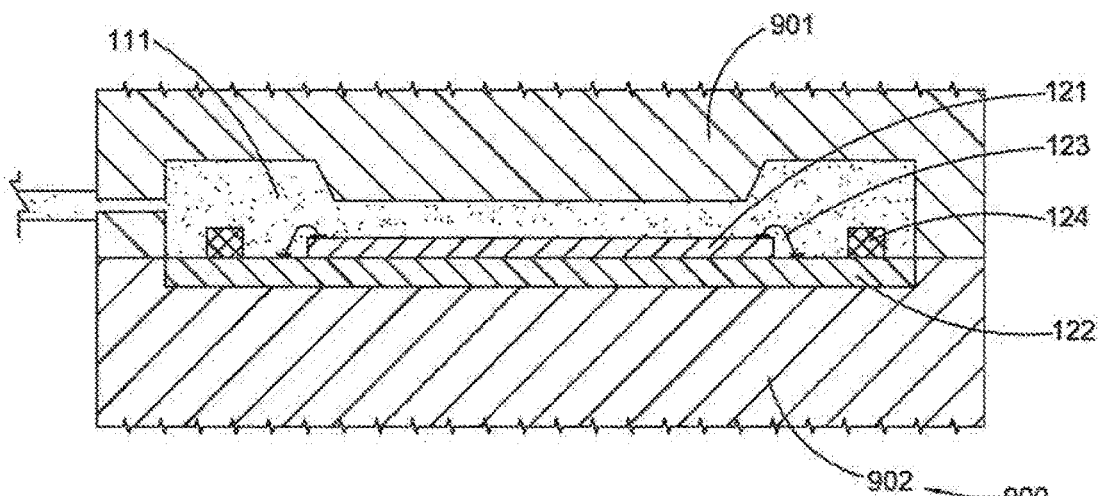
FIG. 3 is a schematic view showing manufacture of the molding photosensitive assembly according to the above embodiments of the present invention.

As shown in FIG. 2 and FIG. 3, when the molding process main body 111 is formed by a molding process, the molding material which is implemented in a fluid state forms the molding portion main body 111 at least integrally molded on the circuit board 122 by a molding die 900 after curing.

Specifically, the molding die 900 includes an upper die 901 and a lower die 902, wherein at least one of the upper die 901 and the lower die 902 can be moved to carry out a clamping operation of the upper die 901 and the lower die 902, and to form at least one molding space 903 between the upper die 901 and the lower die 902, wherein the molding material is added to the molding space 903 and cured to form the molding portion main body 111.

It is to be noted that the molding material in fluid state according to the present invention may be a liquid material or a solid particulate material or a mixed material of liquid and solid particles, it is to be understood that whether the molding material is implemented as a liquid material or as a solid particulate material or as a liquid and solid particulate mixed material, it can be cured to form the molding portion main body 111 after being added to the molding space 903 of the molding die 900. For example, in this specific embodiment of the present invention, the fluid molding material is implemented as a thermosetting material such as a liquid, wherein the molding material is cured to form the molding portion main body 111 after being added to the molding space 903 of the molding die 900. It is to be noted that, after the fluid molding material is added to the molding space 903 of the molding die 900, the curing manner of the fluid molding material does not limit the content and scope of the present invention.

Therefore, the manufacturing difficulty of the molding die 900 is reduced, and since the drop between the top mounting surface and the chip photosensitive surface is no longer required to be realized by the molding die 900, the die only needs to provide a small surface drop to achieve the same structural requirement. The processing difficulty and processing time of the molding die 900 are greatly reduced, and the difficulty of material filling during production is also significantly reduced, the efficiency is improved while the cost is also reduced.

It is to be noted that the molding portion of the molding photosensitive assembly of the present invention is the same as the conventional one, except that the molding die 900 no longer needs to contact the surface of the chip, and the semi-finished product needs to be fixed on the side of the molding die 900 in the cavity of the molding die 900, and the other side is not in contact with the molding die 900 at all.

It should be noted that the formation of the light shielding layer 112 and the filter layer 113 may be performed in any order, the manner of the formation includes but not limited to electroplating, chemical plating, sputtering, attaching, printing, spraying, wrapping, molding, injection molding or the like. At the same time, certain protective measures are applied at the position where the light shielding layer or the filter layer is not required, and the protective measures can be prepared in advance by using other removable materials such as mask, die, other medium or the light shielding layer itself before the process. It is also possible to form the desired layer directly in the desired shape by software setting during the process.

That is, when the molding portion 11 is formed by a molding process, the following steps may be employed:

(a) accommodating the photosensitive portion 12 of the molding photosensitive assembly 10 in the molding space 903 of the molding die 900, wherein The semi-finished product of the molding photosensitive assembly 10 is fixed to the lower die 902, and the photosensitive chip 121 of the molding photosensitive assembly 10 and the inner bottom surface of the upper die 901 have a predetermined interval.

(b) injecting a molding material in a fluid state into the molding space 903, wherein the molding material is a transparent material.

(c) curing the molding material to form the molding portion main body 111, wherein the molding portion main body 111 embeds the surface of the photosensitive portion 12.

(d) forming a light shielding layer at a predetermined position corresponding to the photosensitive chip 121 to define the light passing region 112.

(e) forming a filter layer or a light reflecting layer in the light passing region 112 for filtering light, or (f) attaching a light transmitting element 40 to cover the light passing region 112.

Preferably, the inner bottom surface of the upper die 901 forms a convex portion for forming the light transmitting element mounting groove. The convex portion is gradually reduced in size from top to bottom to reduce drafting resistance. At this time, the light passing region 112 is defined at the bottom of the light transmitting element mounting groove, and the light transmitting element 40 or the filter layer is correspondingly mounted or formed at the light transmitting element mounting groove.

Of course, when the molding portion as shown in FIG. 8 and FIG. 10 is formed, the top of the molding portion 11 is flat, and it is not necessary to form the convex portion. Further, when the molding photosensitive assembly 10C as shown in FIG. 10 is formed, the filter element 40C is first attached to the photosensitive chip 121C, and then step (a) is performed to realize the molding portion 11C embedding the filter element 40C and the surface of the photosensitive chip 121C.

As shown in FIG. 15, the camera module 100G further includes at least one frame-shaped supporting element 70G, wherein the supporting element 70G is disposed on the circuit board 122G, and the molding portion main body 111G embeds at least an outer side of the supporting element 70G after being molded to integrally bond the photosensitive chip 121G, the circuit board 122G, the supporting element 70G to the molding portion main body 111G, wherein the molding portion main body 111G may embed at least a part of the lead 123G, or the supporting element 70G may embed at least a part of the lead 123G, and the molding portion main body 111G and the supporting element 70G respectively embed at least a part of the lead 123G. In other embodiments, the molding portion main body 111G may further embed at least a part of the top surface of the supporting element 70G.

Further, the supporting element 70G is disposed at outer side of the lead 123G, so as not to hinder the connection between photosensitive connection point 1210G of the photosensitive chip 121G and line connection point 1221G of the circuit board 122G, and the required length of the lead 123G is reduced, especially when the lead 123G is a gold wire. At this time, the inner side of the supporting element 70G may embed the lead 123G, or the supporting element 70G and the lead 123G may be embedded by the molding portion 11G.

The supporting element 70G may be formed by, but not limited to, glue after curing, or metal electroplating or chemical plating, or the solution that loses solvent and cures after coating, so that the supporting element 70G protrudes from the circuit board 122G, thereby in the molding process, the flatness of the region where the circuit board 122G is mounted with the photosensitive chip 121G is ensured. In addition, the supporting element 70G may also have elasticity, so that when the molding die 900 is clamped, impact forces generated in the upper die 901 and the lower die 902 are absorbed by the supporting element 70G to avoid acting on the circuit board 122G, in addition, the supporting element 70G can also prevent a gap from being formed between the top surface of the supporting element 70G and the molding surface of the upper die 901 by deformation. Also, the supporting element 70G can support a molding surface of the upper die 901 to prevent the upper die 901 from being pressed against the lead 123G, thereby ensuring a good electrical conductivity of the lead 123G.

The present invention also discloses an array camera module 1000 formed by assembling the molding photosensitive assembly 10 of the present invention, wherein each of the molding portion main bodies is made of a transparent material. The array camera module 1000 can be applied to various electronic devices to help a user to capture an image of an object or a person by using the array camera module, for example, the array camera module can be used to capture image data such as images or videos of objects or people. Preferably, the array camera module can be applied to a mobile electronic device, for example, the mobile electronic device can be, but not limited to, a mobile phone or a tablet device.

As shown in FIG. 16 to FIG. 28, the array camera module of the present invention is illustrated by taking the array camera module being implemented as a dual lens as an example to explain the content and advantages of the present invention in the following description. The array camera module includes two lenses and two molding photosensitive assemblies, and in other embodiments of the present invention, the number of the lenses and the molding photosensitive assemblies may be more, such as three or more. Those skilled in the art will appreciate that the number is not a limitation of the array camera module of the present invention.

It will be understood by those skilled in the art that one of the lenses and one of the molding photosensitive assemblies can cooperate with each other for capturing an image. Specifically, light reflected by a subject, such as an object or a character, is received by the photosensitive chip of the molding photosensitive assembly after being passed through the lens for photoelectric conversion, in other words, the photosensitive chip can convert the optical signal to an electrical signal, and the electrical signal can be transmitted to the electronic device through the circuit board of the molding photosensitive assembly, thereby generating an image related to the photographic subject in the electronic device.

Specifically, as shown in FIG. 16 to FIG. 28, the array camera modules 1000H, 1000I, 1000J, 1000K, 1000L, 1000M, 1000N, 1000O, 1000P, 1000Q, 1000R, 1000S, 1000T respectively include lenses 20H, 20I, 20J, 20K, 20L, 20M, 20N, 20O, 20P, 20Q, 20R, 20S, 20T and molding photosensitive assemblies 10H, 10I, 10J, 10K, 10L, 10M, 10N, 10O, 10P, 10Q, 10R, 10S, 10T. The moving focus camera modules 1000H, 1000I, 1000K, 1000L, 1000M, 1000O, 1000P, 1000Q, 1000S, 1000T may further include drivers 30H, 30I, 30K, 30L, 30M, 30O, 30P, 30Q, 30S, 30T, respectively.

The molding photosensitive assemblies 10H, 10I, 10J, 10K, 10L, 10M, 10N, 10O, 10P, 10Q, 10R, 10S, 10T respectively include light shielding layers 112H, 112I, 112J, 112K, 112L, 112M, 112N, 112O, 112P, 112Q, 112R, 112S, 112T; molding portions 11H, 11I, 11J, 11K, 11L, 11M, 11N, 11O, 11P, 11Q, 11R, 11S, 11T; and photosensitive portions 12H, 12I, 12J, 12K, 12L, 12M, 12N, 12O, 12P, 12Q, 12R, 12S, 12T. The photosensitive portions 12H, 12I, 12J, 12K, 12L, 12M, 12N, 12O, 12P, 12Q, 12R, 12S, 12T respectively include photosensitive chips 121H, 121I, 121J, 121K, 121L, 121M, 121N, 121O, 121P, 121Q, 121R, 121S, 121T; circuit boards 122H, 122I, 122J, 122K, 122L, 122M, 122N, 122O, 122P, 122Q, 122R, 122S, 122T; leads 123H, 123I, 123J, 123K, 123L, 123M, 123N, 123O, 123P, 123Q, 123R, 123S, 123T; electronic components 124H, 124I, 124J, 124K, 124L, 124M, 124N, 124O, 124P, 124Q, 124R, 124S, 124T. The molding portions 11H, 11I, 11J, 11K, 11L, 11M, 11N, 11O, 11P, 11Q, 11R, 11S, 11T respectively include molding portion main bodies 111H, 111I, 111J, 111K, 111L, 111M, 111N, 111O, 111P, 111Q, 111R, 111S, 111T.

The photosensitive chips 121H, 121I, 121J, 121K, 121L, 121M, 121N, 121O, 121P, 121Q, 121R, 121S, 121T respectively have photosensitive regions 1211H, 1211I, 1211J, 1211K, 1211L, 1211M, 1211N, 1211O, 1211P, 1211Q, 1211R, 1211S, 1211T; and non-photosensitive regions 1212H, 1212I, 1212J, 1212K, 1212L, 1212M, 1212N, 1212O, 1212P, 1212Q, 1212R, 1212S, 1212T. The lens and the molding photosensitive assembly described in the above embodiments may be adapted to constitute the array camera module 1000H, 1000I, 1000J, 1000K, 1000L, 1000M, 1000N, 1000O, 1000P, 1000Q, 1000R, 1000S, 1000T, the association between components, preparation methods and features, etc. will not be repeated here.

Figure 16:
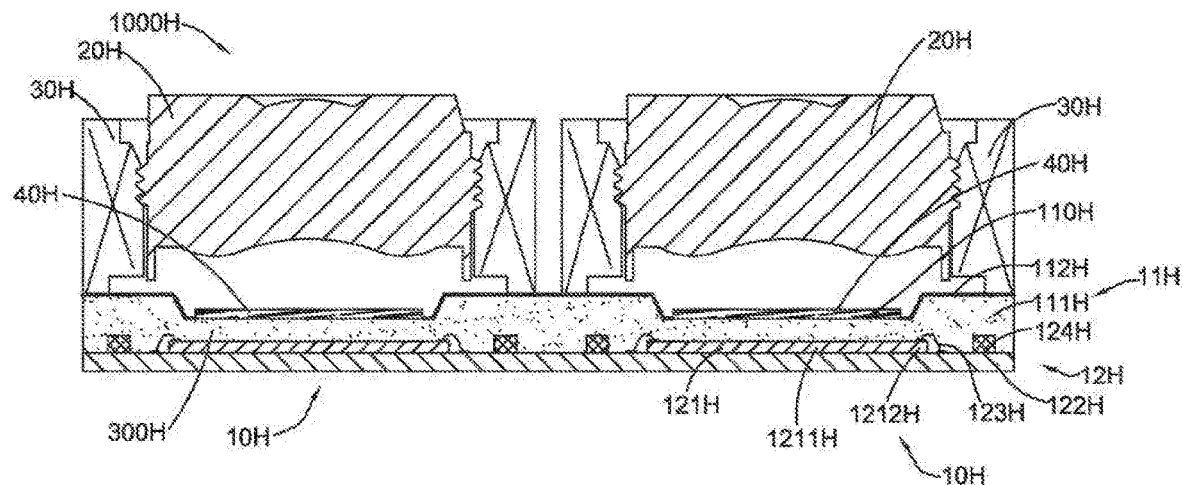
FIG. 16 is a stereoscopic diagram of an array camera module according to an embodiment of the present invention.

As shown in FIG. 16, an implementation of the array camera module 1000H is described, wherein the camera module 1000H includes two lenses 20H, two photosensitive chips 121H, and one circuit board 122H, wherein the circuit board 122H is molded with at least one jointed molding portion 300H and provided with at least two sets of leads 123H, wherein each of the photosensitive chips 121H is respectively attached on a chip attaching region of the circuit board 122H, and each of the photosensitive chips 121H is conducted by the lead 123H. Each of the optical lenses 20H is held in a photosensitive path of each of the photosensitive chips 121H, respectively. The jointed molding portion 300H is formed by integral connection of the adjacent molding portion main bodies 111H. The light shielding layer 112H is covered on the outer surface of the jointed molding portion 300H.

In addition, the array camera module 1000H may further include two drivers 30H, wherein each of the lenses 20H is respectively drivably disposed on each of the drivers 30H, and each of the drivers 30H is respectively attached to the molding portion 11H, so that each of the lenses 20H is respectively held in a photosensitive path of each of the photosensitive chips 121H.

Further, the camera module 1000H may further include at least one filter element 40H, wherein each of the filter elements 40H is respectively held between each of the lenses 20H and each of the photosensitive chips 121H. For example, each of the filter elements 40H may be respectively attached to the molding portion 11H, so that each of the filter elements 40H is held between each of the lenses 20H and each of the photosensitive chips 121H, respectively.

It is to be noted that the array camera module 1000H shown in FIG. 16 is only an example. When the array camera module 1000H is implemented to include more of the lenses 20H, the number of the photosensitive chip 121H, the number of the filter elements 40H, and the number of the drivers 30H may all coincide with the number of the lenses 20H.

That is, the molding photosensitive assembly 10H of the array module 1000H can be implemented as the molding photosensitive assembly 10 of FIG. 1, and in particular, the adjacent circuit boards 122 are connected to form an integral circuit board, that is, the circuit board 122H.

It can be known that the features of the jointed molding portion 300H, the driver 30H, the filter element 40H and the integral circuit board of the array module 1000H can also be applied in the following embodiments, and no longer repeated here.

Figure 17:
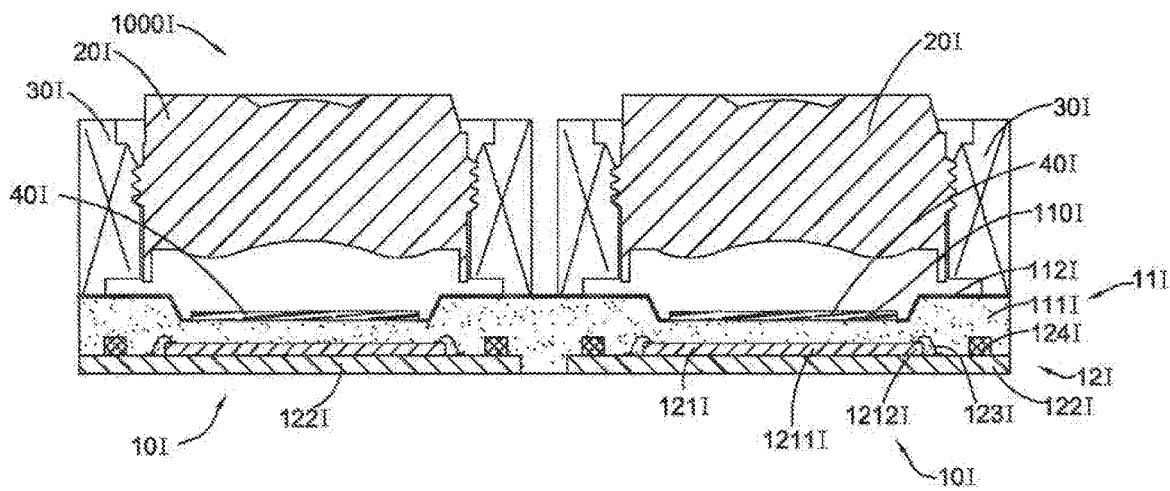
FIG. 17 is a stereoscopic diagram of another embodiment of the array camera module according to the above embodiments of the present invention.

As shown in FIG. 17, a variant implementation of the array camera module 1000H is shown, which is different from the array camera module 1000H of FIG. 16 in that the camera module 1000I includes two lenses 20I and two photosensitive chips 121I and two circuit boards 122I, the molding portion 11I connected makes the two the circuit boards 122I to be molded integrally. That is, the molding photosensitive assembly 10I of the camera module 1000I can be implemented as the molding photosensitive assembly 10 of FIG. 1, in particular, the adjacent circuit boards 122, that is, the circuit boards 122I are spaced apart from each other, wherein the molding portion 11I fills the interval of the adjacent circuit boards 122 to connect the adjacent circuit boards 122.

Figure 18:
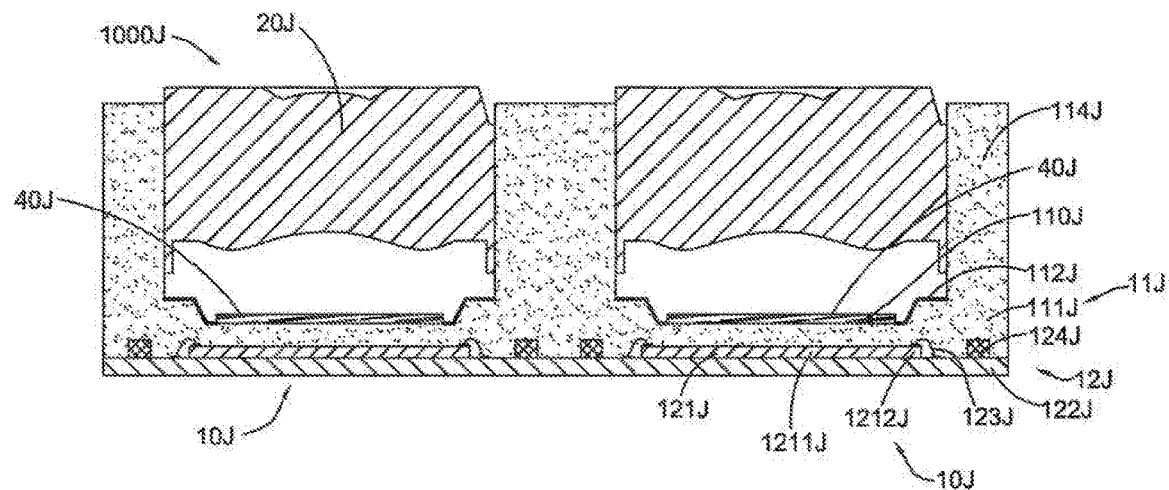
FIG. 18 is a stereoscopic diagram of another embodiment of the array camera module according to the above embodiments of the present invention.

As shown in FIG. 18, another variant embodiment of the array camera module 1000H is illustrated. The molding portion 11J and the molding portion 11 in FIG. 5 have the same structure, that is, the molding photosensitive assembly 10 shown in FIG. 5 is implemented in the present embodiment as a molding photosensitive assembly 10J. Specifically, the molding portion 11J further includes at least one lens mounting section 114J that integrally extends upwardly from the molding portion main body 111J, and each of the lenses 20 is disposed at the lens mounting section 114J, so that each lens is held in the photosensitive path of each of the photosensitive chips 121J, respectively.

Figure 19:
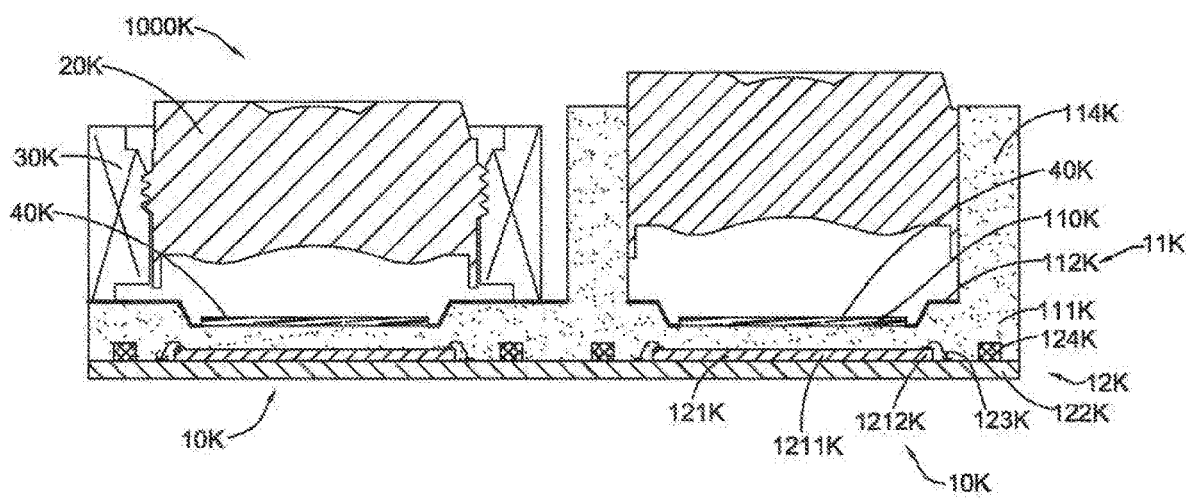
FIG. 19 is a stereoscopic diagram of another embodiment of the array camera module according to the above embodiments of the present invention.

As shown in FIG. 19, another variant embodiment of the array camera module 1000H is illustrated. One of the lenses 20K of the array camera module 1000K is drivably disposed on the driver 30K. The driver 30K is attached to the molding portion 11K, and the other lens 20K is disposed to the lens mounting section 114K, so that the lens 20K is held in the photosensitive path of the photosensitive chip 121K. The molding portion 11K of FIG. 19 is an implementation of the molding portion 11 of FIG. 1 and the molding portion 11 of FIG. 5 in the array camera module 1000K.

That is, as shown in FIGS. 16 to 19, the light shielding layers 112H, 112I, 112J, and 112K respectively define light passing regions 110H, 110I, 110J, and 110K corresponding to the photosensitive regions 1211H, 1211I, 1211J, and 1211K. The filter elements 40H, 40I, 40J, and 40K respectively cover the light passing regions 110H, 110I, 110J, and 110K.

Figure 20:
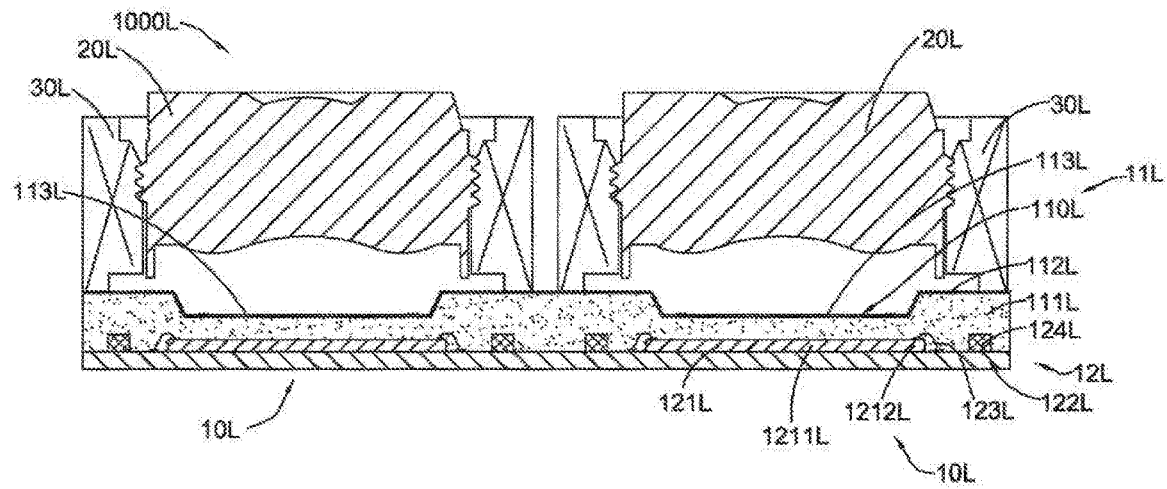
FIG. 20 is a stereoscopic diagram of another embodiment of the array camera module according to the above embodiments of the present invention.

As shown in FIG. 20, another variant embodiment of the array camera module 1000H is illustrated, which is different from the array camera module 1000H of FIG. 16 in that the filter element 40H is omitted. The need for the filter function of the array camera module 1000L is achieved by disposing a filter layer 113L on the top surface of the molding portion 11L. That is, the molding photosensitive assembly 10L is implemented as the molding photosensitive assembly 10 of FIG. 12, and in particular, the adjacent circuit boards 122 are connected to form an integral circuit board, that is, the circuit board 122L.

Figure 21:
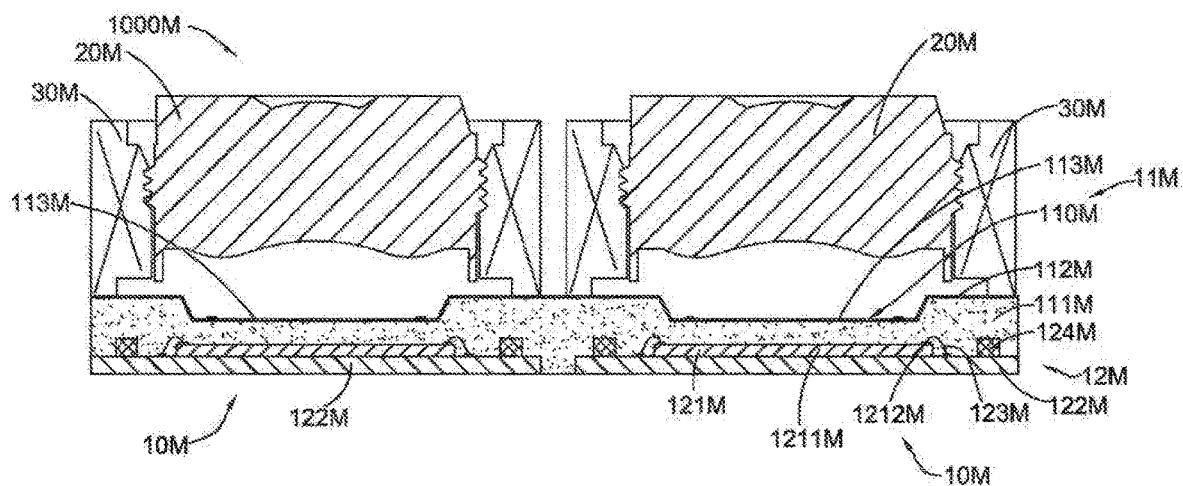
FIG. 21 is a stereoscopic diagram of another embodiment of the array camera module according to the above embodiments of the present invention.

As shown in FIG. 21, another variant embodiment of the array camera module 1000H is shown, which is different from the array camera module 1000L of FIG. 20 in that the camera module 1000M includes two lens 20M, two photosensitive chips 121M, and two circuit boards 122M, and the molding portion 11M connected makes the two circuit boards 122M to be molded integrally. That is, unlike FIG. 20, the circuit boards 122M are spaced apart from each other, wherein the molding portion 11M fills the interval of the adjacent circuit boards 122M to connect the adjacent circuit boards 122M.

Figure 22:
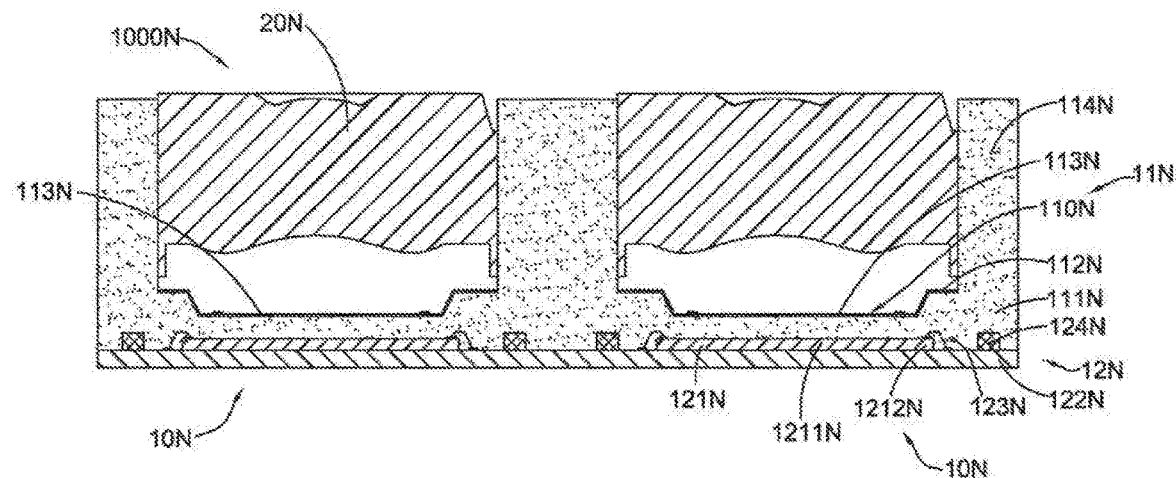
FIG. 22 is a stereoscopic diagram of another embodiment of the array camera module according to the above embodiments of the present invention.

As shown in FIG. 22, another variant embodiment of the array camera module 1000H is illustrated, which is different from the array camera module 1000L of FIG. 20 in that the molding portion 11N further includes at least one lens mounting section 114N, the lens mounting section 114N integrally extends upwardly from the molding portion main body 111N, and each of the lenses 20N is disposed in the lens mounting section 114N, respectively, so that each of the lenses 20N is respectively held in the photosensitive path of each of the photosensitive chips 121N.

Figure 23:
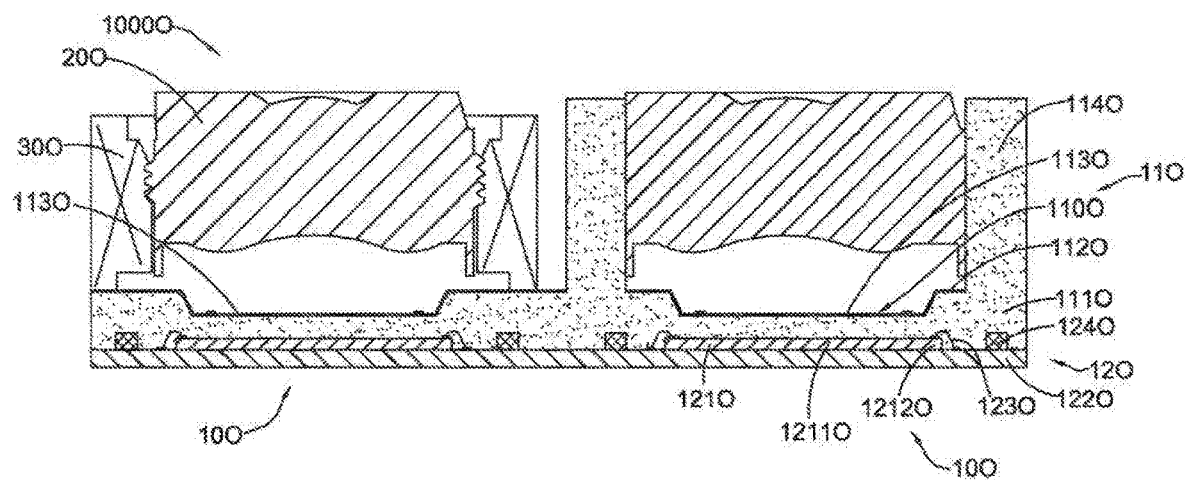
FIG. 23 is a stereoscopic diagram of another embodiment of the array camera module according to the above embodiments of the present invention.

As shown in FIG. 23, another variant embodiment of the array camera module 1000H is shown, which is different from the array camera module 1000N of FIG. 22 in that one of the lens 20O of the array camera modules 1000O is drivably disposed on the driver 30O, the driver 30O is attached to the molding portion 11O, and the other lens 20O is disposed on the lens mounting section 114O to make the lens 20O is held in the photosensitive path of the photosensitive chip 121O.

That is, as shown in FIGS. 20 to 23, the light shielding layers 1211L, 1211M, 1211N, and 1211O respectively define light passing regions 110L, 110M, 110N, and 110O corresponding to the photosensitive regions 1212L, 1212M, 1212N, and 1212O. The filter elements are omitted, and the filter layers 113L, 113M, 113N, and 113O respectively cover the light passing regions 110L, 110M, 110N, and 110O.

The array camera module described above can be implemented based on the MOC process described above, and the specific implementation steps and processes are not described herein.

Figure 24:
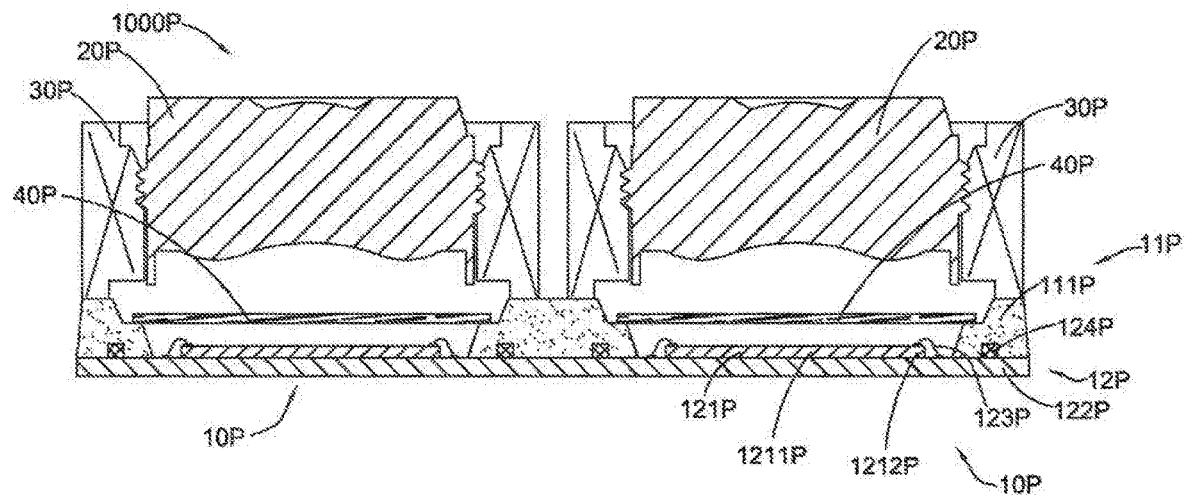
FIG. 24 is a stereoscopic diagram of another embodiment of the array camera module according to the above embodiments of the present invention.

As shown in FIG. 24, another variant embodiment of the array camera module 1000H is illustrated. The structure of the molding portion 11P of the array camera module 1000P and the structure of the molding portion 11E of FIG. 13 are the same. In particular, adjacent circuit boards 122 are connected to form an integral circuit board, that is, circuit board 122P.

Figure 25:
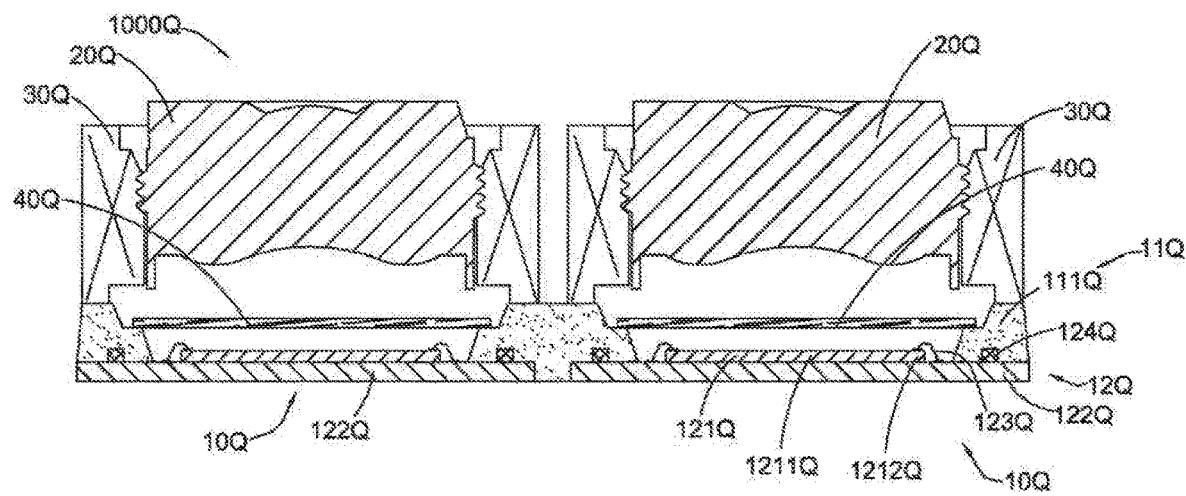
FIG. 25 is a stereoscopic diagram of another embodiment of the array camera module according to the above embodiments of the present invention.

As shown in FIG. 25, another variant embodiment of the array camera module 1000H is shown, which is different from the array camera module 1000P of FIG. 24 in that the camera module 1000Q includes two lens 20Q, two photosensitive chips 121Q, and two circuit boards 122Q, and the molding portion 11Q connected makes the two circuit boards 122Q to be molded integrally. That is, the circuit boards 122Q are spaced apart from each other, wherein the molding portion 11Q fills the interval of the adjacent circuit boards 122Q to connect the adjacent circuit boards 122Q.

Figure 26:
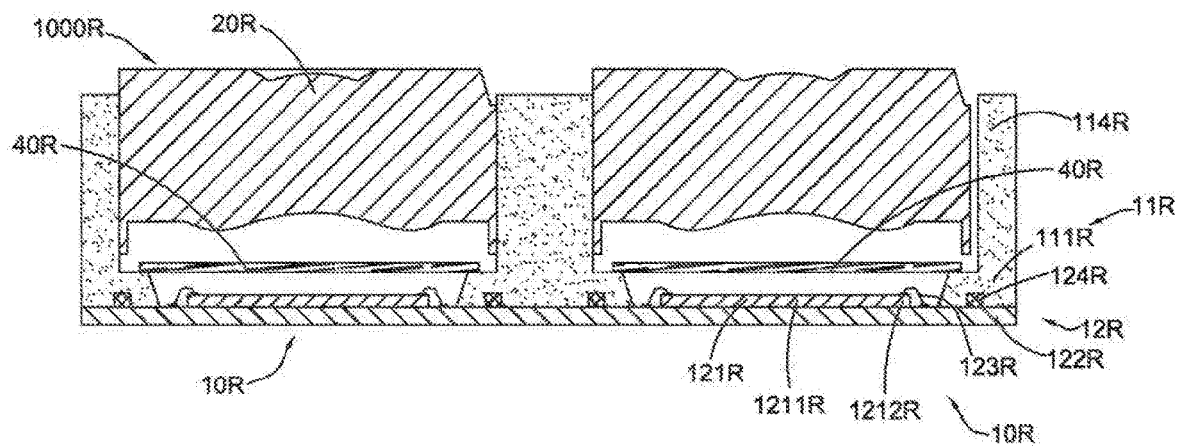
FIG. 26 is a stereoscopic diagram of another embodiment of the array camera module according to the above embodiments of the present invention.

As shown in FIG. 26, another variant embodiment of the array camera module 1000H is shown, which is different from the array camera module 1000P of FIG. 24 in that the molding portion 11R of the array camera module 1000R is further includes at least one lens mounting section 114R that integrally extends upwardly from the molding portion main body 111R, and each lens is respectively disposed on the lens mounting section 114R, so that each of the lenses 20R are respectively held in the photosensitive path of each of the photosensitive chips 121R. That is, the structure of the molding photosensitive assembly 10R is the same as that of the molding photosensitive assembly 10F shown in FIG. 14, and in particular, the adjacent circuit boards 122F are adjacent to each other to form an integral circuit board, that is, the circuit board 122R.

Figure 27:
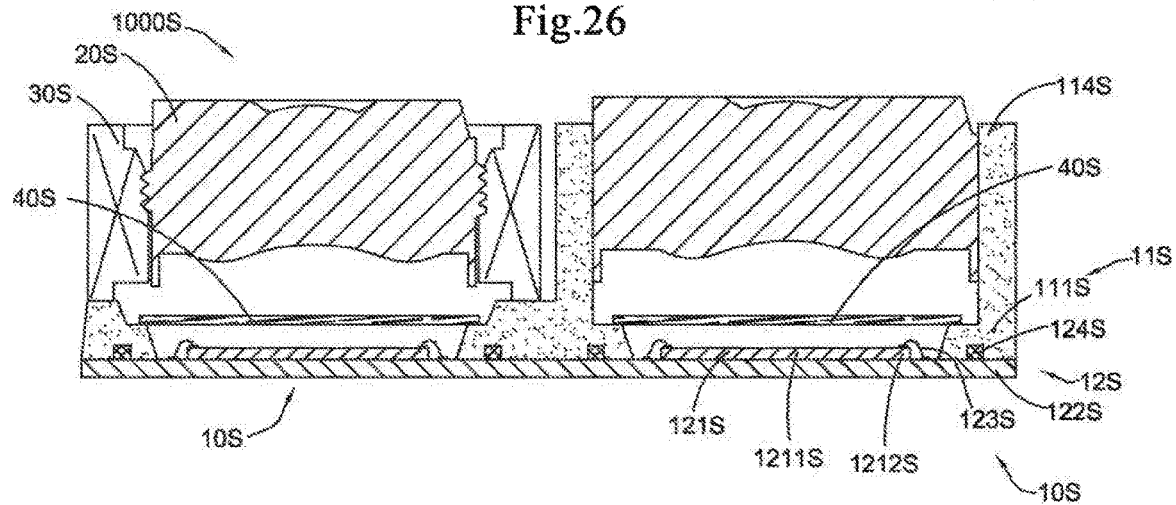
FIG. 27 is a stereoscopic diagram of another embodiment of the array camera module according to the above embodiments of the present invention.

As shown in FIG. 27, another variant embodiment of the array camera module 1000H is shown, which is different from the array camera module 1000R of FIG. 26 in that one of the lens 20S of the array camera modules 1000S is drivably disposed on the driver 30S, the driver 30S is attached to the molding portion 11S, and the other lens 20S is disposed on the lens mounting section 114S to make the lens 20S to be held in the photosensitive path of the photosensitive chip 121S.

Figure 28:
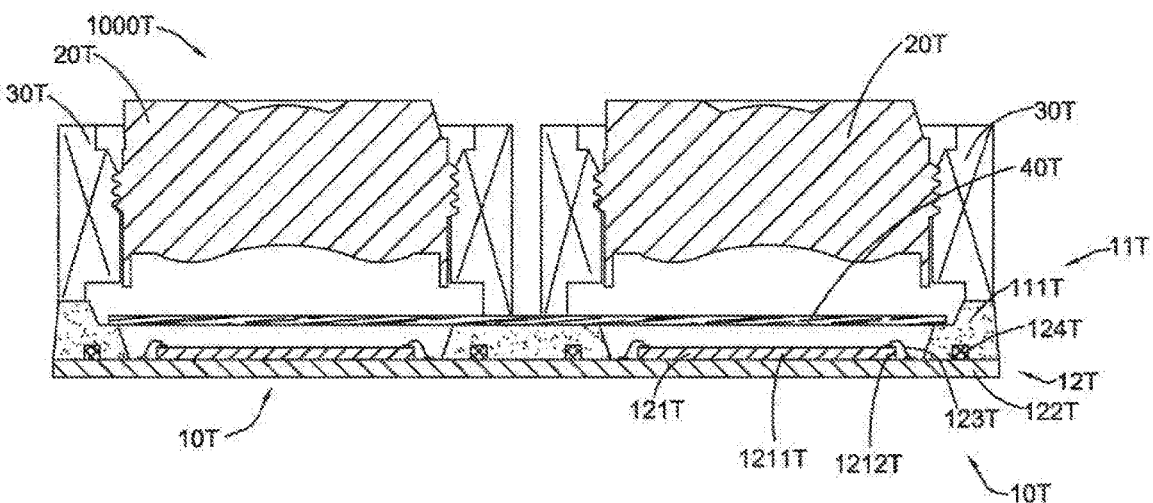
FIG. 28 is a stereoscopic diagram of another embodiment of the array camera module according to the above embodiments of the present invention.

As shown in FIG. 28, another variant embodiment of the array camera module 1000H is shown, which is different from the above embodiment in that the number of the filter elements 40T of the array camera module 1000T is implemented as one, so that each of the lenses 20T may correspond to different positions of the filter element 40T, respectively. That is, the light transmitting elements of the adjacent camera modules 1000T are connected to form an integer, that is, the light transmitting elements 40T.

That is, the array camera module shown in FIGS. 24 to 28 can be implemented based on the above-described MOB process, and will not be described here. At this time, the light transmitting elements 40P, 40Q, 40R, 40S, and 40T are respectively supported by the molding portion main bodies 111P, 111Q, 111R, 111S, and 111T, and respectively correspond to the photosensitive regions of the photosensitive chips 121P, 121Q, 121S, and 121T.

It is to be noted that, in other embodiments of the present invention, when the molding photosensitive assembly and other common optical lenses are assembled to form a camera module or an array camera module, the molding portion main body 111 and the optical lens of the transparent material formed by the MOC molding process of FIGS. 1 to 12 can form at least one lens group of the camera module or the array camera module. That is, the molding portion main body 111 after molding can assist other common lens optical designs. Since the transparent material has a greater refractive index to the light than the air, different optical properties can be obtained by adjusting the different thicknesses of the transparent layer above the chip and different materials or even different surface shapes, which is equivalent to an whole piece of transparent material and the lens above forming a huge lens group together, which provides more design space for the lens design, and finally a camera module or an array camera module can be assembled to be formed to obtain better optical performance and smaller form factor.

It is to be noted that the internal structure can be directly observed before the formation of the light shielding layer 112, the complicated process of ultrasonic or X-ray inspection is omitted, and the efficiency of poor quality discovery is improved; and if an abnormality occurs in all subsequent processes, alternatively, the light shielding layer 112 may be removed to expose the transparent portion of the molding portion 11, and the product may be directly inspected for problems.

In addition, it is to be noted that since the molding photosensitive assembly is assembled to form a camera module or other components of the array camera module, such as a lens and a driver, etc., which can be fixed by using opaque glue, it can also function as a light blocking function. The light shielding layer 112 at the position of the glue can also be omitted to save material and process. At the same time, when the molding photosensitive assembly is assembled to form a camera module or an array camera module is disposed inside the electronic device 200, if there is no illumination or light on the side of the camera module or the array camera module assembly position to be blocked by other components of the device, the side light shielding layer 112 can also be omitted.

It is to be noted that the present invention mainly describes the features and advantages of the camera module of the present invention by taking a single camera module as example, but those skilled in the art can understand that in other embodiments, the camera module 100 may also be a dual-lens camera module or an array camera module. Therefore, the single camera module does not constitute a limitation on the content and scope of the present invention.

Those skilled in the art should understand that the embodiments of the present invention described in the above description and the accompanying drawings are only by way of illustration and not limitation of the present invention. The object of the present invention has been achieved completely and efficiently. The function and structural principle of the present invention have been shown and described in the embodiments, and there may be any variations or modifications to the embodiments of the present invention without departing from the principles.

The invention claimed is:

1. A molding photosensitive assembly applied in at least one camera module, comprising:
   a molding portion, wherein the molding portion comprises a molding portion main body, and the molding portion main body is made of transparent material;
   a photosensitive chip;
   a light shielding layer, wherein the light shielding layer is covered on an outer surface of the molding portion main body, the light shielding layer defines at least one light passing region on a top surface of the molding portion main body, and the light passing region corresponds to the photosensitive chip to provide a light path of the photosensitive chip; and
   a circuit board, wherein the photosensitive chip is attached to the circuit board in an electrical connection;
   wherein the molding portion main body of the molding portion, the photosensitive chip and the circuit board are formed into an integral structure by a molding process, and wherein the molding portion main body has at least one groove, and the groove is recessed by the top surface of the molding portion main body, and the light passing region is disposed in the groove.

2. The molding photosensitive assembly according to claim 1, wherein the molding portion main body completely embeds the photosensitive chip and the circuit board.

3. The molding photosensitive assembly according to claim 1, further comprising a filter layer, wherein the filter layer covers the light passing region.

4. The molding photosensitive assembly according to claim 3, wherein an edge of the filter layer and an edge of the light shielding layer are overlapped.

5. The molding photosensitive assembly according to claim 1, further comprising a light reflecting layer, wherein the light reflecting layer covers the light passing region.

6. The molding photosensitive assembly according to claim 5, wherein an edge of the light reflecting layer and an edge of the light shielding layer are overlapped.

7. The molding photosensitive assembly according to claim 1, further comprising a light transmitting element, wherein the light transmitting element is mounted to the groove to cover the light passing region.

8. The molding photosensitive assembly according to claim 7, wherein the molding portion main body is enveloped on the peripheral side and the bottom portion of the light transmitting element, and the top surface of the light transmitting element and the top surface of the molding portion main body are in a same plane.

9. The molding photosensitive assembly according to claim 7, wherein the groove is gradually reduced from top to bottom.

10. The molding photosensitive assembly according to claim 1, further comprising a light transmitting element, wherein the light transmitting element is attached to a surface of the photosensitive chip, and the molding portion main body embeds the light transmitting element on the photosensitive chip.

11. The molding photosensitive assembly according to claim 1, wherein the molding portion further comprises at least one lens mounting section, and the lens mounting section is formed by extending upward from a periphery of the molding portion main body, and the lens mounting section and the molding portion main body are connected by integrally molding.

12. The molding photosensitive assembly according to claim 1, further comprising at least one electronic component, wherein the electronic component is electrically connected to the circuit board, and the molding portion main body embeds the photosensitive chip, the circuit board and the electronic component.

13. The molding photosensitive assembly according to claim 1, further comprising at least one lead, wherein the lead electrically connects the photosensitive chip and the circuit board, and the molding portion main body embeds the lead.

14. The molding photosensitive assembly according to claim 1, wherein the molding portion main body has at least one through hole, and the through hole corresponds to the photosensitive chip to provide the light path of the photosensitive chip.

15. The molding photosensitive assembly according to claim 14, wherein the through hole is gradually increased from bottom to top.

16. A camera module, comprising:
   a lens; and
   a molding photosensitive assembly according to claim 1, wherein the lens is supported on a photosensitive path of the photosensitive assembly.

17. An array camera module, comprising:
   at least two lenses;
   at least two photosensitive chips, wherein the lens is held in a corresponding photosensitive path of the photosensitive chip;
   at least one circuit board, wherein the photosensitive chip is attached to the circuit board in an electrical connection;
   a jointed molding portion comprising a molding portion main body, wherein the jointed molding portion, the circuit board, and the photosensitive chip are integrally molded by a molding process, and the jointed molding portion is made of a transparent material; and
   a light shielding layer, wherein the light shielding layer is covered on an outer surface of the molding portion main body, the light shielding layer defines at least one light passing region on a top surface of the molding portion main body, and the light passing region corresponds to the at least two photosensitive chips to provide light paths of the at least two photosensitive chips, wherein the molding portion main body has at least one groove, and the groove is recessed by the top surface of the molding portion main body, and the light passing region is disposed in the groove.

* * * * *